(12) United States Patent
Wang

(10) Patent No.: US 8,101,996 B2
(45) Date of Patent: Jan. 24, 2012

(54) THREE-DIMENSIONAL SEMICONDUCTOR DEVICE STRUCTURES AND METHODS

(75) Inventor: Qi Wang, Sandy, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 644 days.

(21) Appl. No.: 12/103,701

(22) Filed: Apr. 15, 2008

(65) Prior Publication Data

US 2009/0256196 A1 Oct. 15, 2009

(51) Int. Cl.
*H01L 29/66* (2006.01)
(52) U.S. Cl. ............................. 257/334; 257/E21.614
(58) Field of Classification Search ............... 257/334, 257/E21.614, E29.255, E21.575; 438/622, 438/74, 109
See application file for complete search history.

(56) References Cited

U.S. PATENT DOCUMENTS

| | | | |
|---|---|---|---|
| 4,612,083 A * | 9/1986 | Yasumoto et al. | ............... 438/59 |
| 6,355,501 B1 | 3/2002 | Fung et al. | |
| 6,642,081 B1 | 11/2003 | Patti | |
| 6,875,671 B2 | 4/2005 | Faris | |
| 6,940,085 B2 | 9/2005 | Fricke et al. | |
| 7,045,878 B2 | 5/2006 | Faris | |
| 7,145,219 B2 | 12/2006 | Faris | |
| 7,157,787 B2 | 1/2007 | Kim et al. | |
| 7,564,137 B2 * | 7/2009 | Lam | ............................. 257/774 |
| 2004/0051170 A1 | 3/2004 | Kawakami et al. | |
| 2006/0214222 A1 * | 9/2006 | Challa et al. | ................... 257/328 |
| 2006/0226491 A1 | 10/2006 | Gauthier, Jr. et al. | |
| 2007/0235886 A1 | 10/2007 | Yilmaz et al. | |
| 2008/0283971 A1 * | 11/2008 | Huang et al. | ................... 257/620 |

OTHER PUBLICATIONS

International Search Report of the International Searching Authority for Application No. PCT/US2009/040708, mailed on Dec. 3, 2009, 3 pages.
Written Opinion of the International Searching Authority for Application No. PCT/US2009/040708, mailed on Dec. 3, 2009, 3 pages.

* cited by examiner

*Primary Examiner* — Ha Tran T Nguyen
*Assistant Examiner* — Shaun Campbell
(74) *Attorney, Agent, or Firm* — Kilpatrick Townsend & Stockton LLP

(57) ABSTRACT

A three-dimensional semiconductor device structure includes a first semiconductor device and a second semiconductor device bonded together using a patterned conductive layer according to an embodiment of the invention. The first semiconductor device includes a first plurality of terminals on its front side, and the second semiconductor device includes a second plurality of terminals on its front side. The patterned conductive layer includes a plurality of conductive regions. Each of the conductive regions is bonded to a conductor coupled to one of the first plurality of terminals and bonded to another conductor coupled to one of the second plurality of terminals, providing electrical coupling between the first semiconductor device and the second semiconductor device. In a specific embodiment, each terminal of the first semiconductor device is bonded to a corresponding terminal of the second semiconductor device, providing a parallel combination of the first and the second semiconductor devices.

4 Claims, 22 Drawing Sheets

THREE-DIMENSIONAL SEMICONDUCTOR DEVICE STRUCTURES AND METHODS

BACKGROUND OF THE INVENTION

The present invention relates in general to semiconductor technology, and more particularly to methods and structures for three-dimensional (3D) stacked semiconductor devices. Merely by way of example, the invention has been applied to forming 3D stacked semiconductor devices incorporating two or more trench field effect transistors (FETs). But it would be recognized that the invention has a much broader range of applicability.

High voltage and/or high power devices are finding increasingly broad applications in modern electronics. For example, these devices are used in applications such as portable consumer electronics, power management circuits, automotive electronics, disk drives, display devices, RF communication circuits, and wireless base station circuits. Some of the power devices include shielded gate trench FETs and trench gate FETs. An example is briefly discussed below.

FIG. 1 is a simplified cross sectional view diagram of a shielded gate trench MOSFET. An n-type epitaxial layer 102 extends over n+ substrate 101. N+ source regions 108 and p+ heavy body regions 106 are formed in a p-type body region 104, which is in turn formed in epitaxial layer 102. Trench 110 extends through body region 104 and terminates in the drift region which is the portion of epitaxial layer 102 extending between body region 104 and substrate 101. Trench 110 includes a shield electrode 114 below a gate electrode 122. Gate electrode 122 is insulated from its adjacent silicon regions by gate dielectric 120, and shield electrode 114 is insulated from adjacent silicon regions by a shield dielectric 112 which is thicker than gate dielectric 120. The gate and shield electrodes are insulated from each other by a dielectric layer 116 also referred to as inter-electrode dielectric or IED.

The structure of FIG. 1 can be repeated many times to form an array of transistors. FIG. 2 is a simplified cross-sectional view diagram illustrating a portion of a trench MOSFET 200, which includes substrate 201, epitaxial layer 202, and body region 204. Device 200 also includes an array of trench cells 206 linked together in parallel. Each of trench cell 206 is similar to the shielded gate FET of FIG. 1. Conductive region 214, which is protected by dielectric layer 226, is the gate electrode of MOSFET 200, and is connected to the gate electrode in each trench cell. Contact to the drain region can be made on the back side of the device. Contacts to the source metal can be made on the top surface of the device, whereas contacts to the gate electrode can be made in an edge portion of the top surface.

In power electronics applications, the demand for higher performance and lower cost continues to increase. On the other hand, as power device technology advances, it becomes increasing difficult to improve the performance. For example, scaling down cell dimension requires complicated processing. Additionally, as the device area is reduced, the power handling capacity may suffer. These and other limitations pose great challenges to further improvement of power devices.

Thus, there is a need for improved structures and methods for forming high-performance, low cost power devices.

BRIEF SUMMARY OF THE INVENTION

In accordance with an embodiment of the invention, a three-dimensional semiconductor device includes two semiconductor devices bonded together. Each of the two semiconductor devices has at least two device terminals on a front side of a semiconductor region and a metal substrate on a back side of the semiconductor region. One of the front side terminals is electrically connected to the metal substrate. The metal substrate of the first semiconductor device is mechanically bonded to the metal substrate of the second semiconductor device. Accordingly, an electrical connection is provided between one of the front side terminals of the first semiconductor device and one of the front side terminals of the second semiconductor device.

In a specific embodiment, each of the semiconductor devices also includes a conductive region filling a void in the semiconductor region and connecting the front side terminal to metal substrate.

In another embodiment, both the first and the second semiconductor device are MOS transistors, and the drain terminals of the MOS transistors are electrically coupled. As an example, each of the semiconductor devices is a trench gate MOSFET. In another example, each of the semiconductor devices is a shielded gate trench MOSFET.

According to another embodiment of the invention, a method for forming a three-dimensional semiconductor device includes providing a first semiconductor device including a semiconductor region on a first metal substrate, the first semiconductor device having at least a first terminal and a second terminal on a front side of the semiconductor region opposite the first metal substrate, the first terminal being electrically coupled to the first metal substrate. The method also includes providing second semiconductor device including a semiconductor region on a second metal substrate, the second semiconductor device having at least a first terminal and a second terminal on a front side of the semiconductor region opposite the second metal substrate, the first terminal being electrically coupled to the second metal substrate. Additionally, the method includes bonding the first metal substrate with the second metal substrate, thereby providing electrical contact between the first terminal of the first semiconductor device and the first terminal of the second semiconductor device.

In a specific embodiment, the process of providing each of the first and the second semiconductor devices includes forming a device structure in a semiconductor substrate. The device structure has at least a first device region and a second device region on a front side of the semiconductor substrate. The method includes forming a first recess in a front portion of the semiconductor substrate and extending into the semiconductor substrate by a predetermined depth. A first metal layer is formed overlying the device structure and filling the first recess, and then the first metal layer is patterned to form the first terminal and the second terminal, the first terminal being substantially aligned to the first recess. The method also includes attaching a carrier substrate to a front side of the device structure, and forming a second recess in a back portion of the semiconductor substrate. The second recess is substantially aligned to the first recess. Subsequently, a second metal layer is formed overlying the back side of the substrate. The second metal layer fills the second recess and forms the metal substrate.

According to another embodiment of the invention, a three-dimensional semiconductor device includes a first semiconductor device and a second semiconductor device bonded together using a patterned conductive layer. The first semiconductor device includes a first plurality of terminals on its front side, and the second semiconductor device includes a second plurality of terminals on its front side. The patterned conductive layer includes a plurality of conductive regions. Each of the conductive regions is bonded to a conductor coupled to one of the first plurality of terminals and another conductor coupled to one of the second plurality of terminals for providing electrical coupling between the first semiconductor device and the second semiconductor device.

In a specific embodiment, each terminal of the first semiconductor device is bonded to a corresponding terminal of the second semiconductor device, whereby the three-dimensional semiconductor device includes a parallel combination of the first and the second semiconductor devices.

Depending upon the embodiments, one or both of the first semiconductor devices can be a transistor, such as a trench power MOS transistor, or a shielded gate trench power MOS transistor, or other semiconductor devices.

According to another embodiment of the invention, a method for forming a three-dimensional semiconductor device includes providing a first and a second semiconductor devices. The first semiconductor device has a first plurality of terminals on its front side, and the second semiconductor device has a second plurality of terminals on its front side. A first plurality of conductors are formed on the first semiconductor device, each of which being coupled to one of the first plurality of terminals. A second plurality of conductors are formed on the second semiconductor device, each of which being coupled to one of the second plurality of terminals. The method also includes providing a patterned conductive layer, which includes a plurality of interconnected conductive regions. The patterned conductive layer is then bonded with the first and the second semiconductor devices. Each of the plurality of conductive regions is bonded to at least one of the first plurality of conductors and at least one of the second plurality of conductors. Then portions of the patterned conductive layer are selectively removed to separate the plurality of conductive regions and to provide one or more external contacts for the three-dimensional semiconductor device.

Depending upon the embodiments, one or both of the first semiconductor devices can be a transistor, such as a trench power MOS transistor, or a shielded gate trench power MOS transistor, or other semiconductor devices.

In one embodiment, each of the first and the second semiconductor devices comprises a transistor, and each terminal of the first semiconductor device is bonded to a corresponding terminal of the second semiconductor device. Accordingly, the three-dimensional semiconductor device includes a parallel combination of the first and the second semiconductor devices. In another embodiment, at least one of the first and the second semiconductor devices comprises an MOS transistor. In yet another embodiment, at least one of the first and the second semiconductor devices comprises a trench gate MOS transistor or a shielded gate trench MOS transistor.

According to another embodiment, the methods provided by the present invention that can be combined and/or repeated to form different three-dimensional device structures and to provide a variety of functionalities. For example, in a specific embodiment, a stacked semiconductor device structure includes four semiconductor devices. A first semiconductor device includes a first substrate and a first plurality of terminals, and a second semiconductor device includes a second substrate and a second plurality of terminals. The first and second semiconductor devices are bonded together using a first patterned conductive layer disposed between the first and the second semiconductor devices. The first patterned conductive layer includes a plurality of conductive regions. Each of the conductive regions is bonded to a conductor coupled to one of the first plurality of terminals and bonded to another conductor coupled to one of the second plurality of terminals. Similarly, a third and fourth semiconductor are bonded together using a second patterned conductive layer. Additionally, the substrate of the second semiconductor device is bonded to the third semiconductor device to form the three-dimensional stack of four semiconductor devices.

According to another embodiment of the invention, a stacked semiconductor device structure includes a first bonded device pair and a second bonded device pair. The first bonded device pair includes a first semiconductor device and a second semiconductor device. The first and the second semiconductor devices are positioned such that a front side of the first semiconductor device faces a front side of the second semiconductor device. Additionally, at least one of the terminals of the first semiconductor device is bonded to one of the terminals of the second semiconductor device. Similarly, the second bonded device pair includes a third semiconductor device and a fourth semiconductor device, with a front side of the third semiconductor device facing a front side of the fourth semiconductor device, and at least one of the terminals of the third semiconductor device being bonded to one of the terminals of the fourth semiconductor device. Moreover, the first bonded device pair is bonded to the second bonded device pair, with a back side of the second semiconductor device being bonded to a back side of the third semiconductor device.

According to an alternative embodiment of the invention, a three-dimensional semiconductor device includes two first semiconductor devices bonded together using conductive structures and a patterned metal layer. A first semiconductor device has a first metal substrate on its back side, the first metal substrate also functioning as a first terminal of the first semiconductor device. A first conductive structure is formed on a back side of the first metal substrate. The second semiconductor device has a first terminal and a second terminal on its front side. A second conductive structure is formed on a front side of the second semiconductor device. The second conductive structure is bonded to the first conductive structure for providing electrical contact between the first semiconductor device and the second semiconductor device. A third conductive structure is formed on the front side of the second semiconductor device. A patterned metal layer is located between the first and the second semiconductor devices. The patterned metal layer includes at least a first region, which is bonded to the third conductive structure for providing an external contact.

Depending on the embodiment, a variety of semiconductor devices can used in forming the three dimensional device structures. For example, at least one of the first and the second semiconductor devices can an MOS transistor. In another example, at least one of the first and the second semiconductor devices is a trench power MOS transistor. In yet another example, at least one of the first and the second semiconductor devices is a trench power MOS transistor. In other examples, each of the first and the second semiconductor devices is an MOS transistor.

In a specific embodiment, the first conductor is coupled to a first terminal of the first semiconductor device and the second conductor is couple to a first terminal of the second semiconductor device, whereby the three-dimensional semiconductor device comprises a series combination of the first and the second semiconductor devices.

According to another embodiment, the methods provided by the present invention that can be combined and/or repeated to form different three-dimensional device structures and to provide a variety of functionalities.

Many benefits are achieved by way of the present invention over conventional techniques. For example, in some embodiments, the invention provides methods for forming three-dimensional devices with increased device density without increasing die size or footprint. This increase in density can be achieved without pitch reduction at the cell level. In a conventional device, the area taken up by heavy body contacts can make cell pitch reduction challenging. In other embodiments, the bonding configuration in the three-dimensional devices also includes internal device interconnections to provide diverse device functionalities.

In alternative embodiments, the invention provides methods that can stack together devices having different characteristics. In some embodiments, the methods provided by the invention can be combined and repeated for integrating different devices using customized bonding configurations. For example, in an embodiment, the method can be used for integrating both power switches and other functional devices, such as drivers and controllers to make functional power devices. As another example, in some embodiment, the device building blocks are scalable; i.e., they can be repeatedly used for more stacking and further three dimensional die integration. Additionally, the invention provides processes that are compatible with conventional process technology, and would not require substantial modification to existing processes or equipment. Depending upon the embodiment, one or more of these benefits may be achieved. These and other benefits will be described in more detail throughout the present specification.

Various additional objects, features, and advantages of the present invention can be more fully appreciated with reference to the detailed description and accompanying drawings that follow.

DETAILED DESCRIPTION OF THE INVENTION

The present invention relates in general to semiconductor technology, and more particularly to methods and structures for three-dimensional (3D) stacked semiconductor devices. According to embodiments of the invention, various techniques and structures can be used for bonding two semiconductor devices to form three-dimensional device structures. For example, a back side metal substrate can be used in bonding and making electrical connections. In another example, conductive structures such as metal posts are formed to facilitate bonding. In yet another example, the bonding process uses a patterned metal layer that includes interconnected conductive regions. These conductive regions can be used to bond terminals in the first device to terminals in a second device. According to certain embodiments, the bonding provides mechanical attachment as well as electrical connections between two devices. Accordingly, the three-dimensional device structures not only increase device packing density, they can also provide various device functionalities by using customized bonding arrangements. In some embodiments, the bonding structures and methods can be used in combination or even repeatedly used to create various three-dimensional structures.

Figure 3:
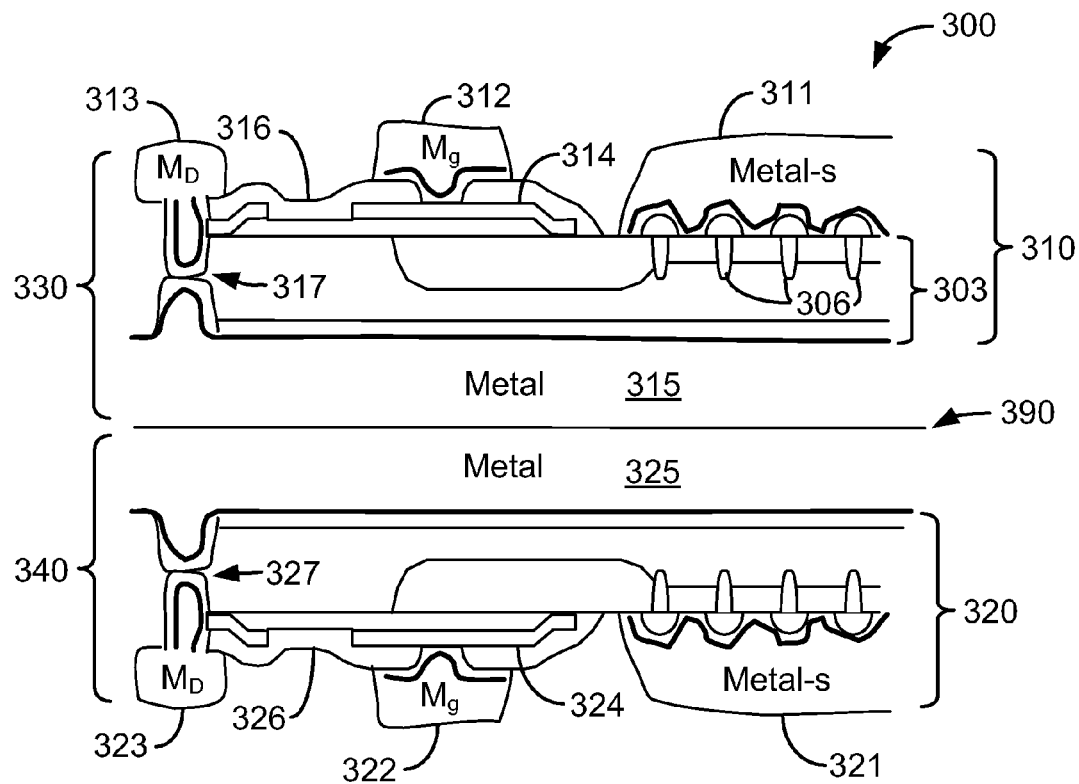
FIG. 3 is a simplified cross-sectional view diagram illustrating a three-dimensional semiconductor device 300 according to an embodiment of the present invention.

FIG. 3 is a simplified cross-sectional view diagram illustrating a three-dimensional semiconductor device 300 according to an embodiment of the present invention. This diagram is merely an example, which should not unduly limit the scope of the claims herein. One of ordinary skill in the art would recognize other variations, modifications, and alternatives. As shown, three-dimensional semiconductor device 300 includes device 330 and device 340. Device 330 includes a first trench MOS transistor 310 on a first metal substrate 315, whereas device 340 includes a second trench MOS transistor 320 on a second metal substrate 325.

Figure 1:
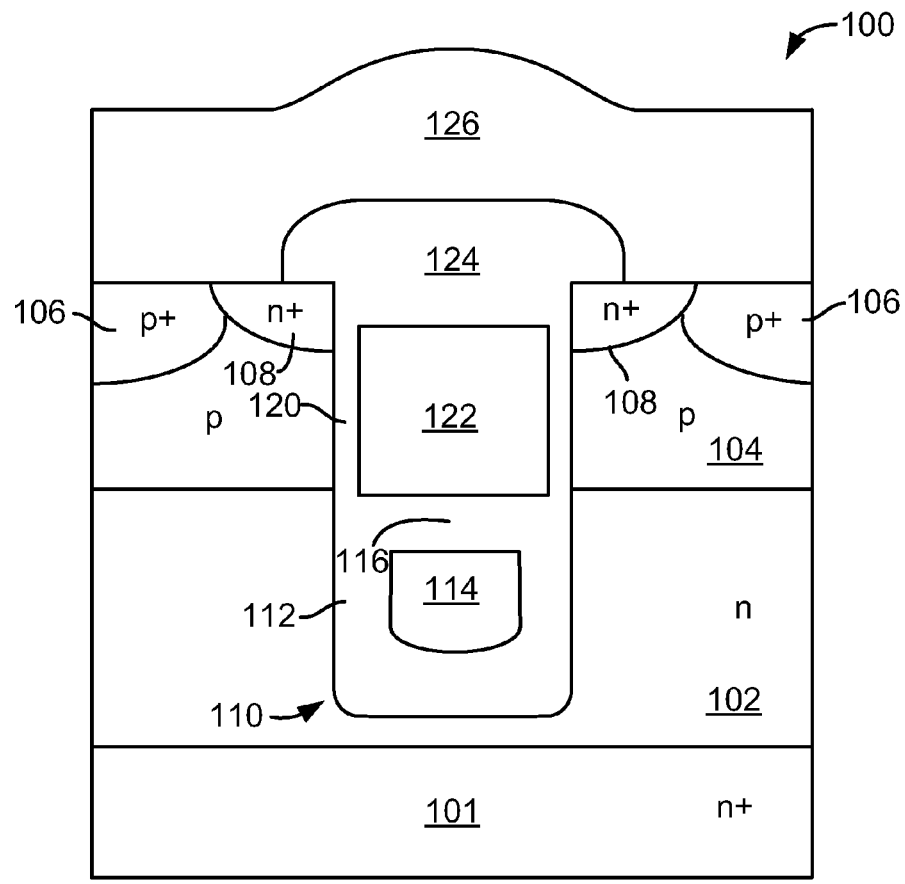
FIG. 1 is a cross-sectional view of a conventional high voltage trench MOS field effect transistor (FET)

In FIG. 3, MOS transistor 310 includes trench cells 306 in a semiconductor region 303 on the metal substrate 315. Each of the trench cells 306 can be a device structure similar to device 100 in FIG. 1. Depending on the embodiments, there can be other variations, modifications, and alternatives. For example, in a specific embodiment, each cell is a trench gate trench MOSFET, which further includes a trench extending into a semiconductor region, a gate dielectric layer lining sidewalls and bottom of the trench, a gate electrode over the gate dielectric in the trench, source regions flanking each side of the gate electrode in the trench, a drift region, and a body region extending over the drift region. Additionally, the drain electrode is connected to drain regions below the draft region.

As shown, trench MOS transistor 310 includes a drain terminal 313, a source terminal 311, and a gate terminal 312 on a front side of the semiconductor region 303 opposite the metal substrate 315. The source terminal 311 is connected to the source regions of the cells. The gate terminal 312 is connected to the gate electrodes in the cells. Trench MOS transistor 310 further includes a conductive region formed in a void 317 in the semiconductor region that connects the drain terminal 313 to the metal substrate 315.

In FIG. 3, device 300 also includes a second trench MOS transistor 320 that has similar device features as MOS transistor 310 described above. In particular, MOS transistor 320 includes a metal substrate 325, a source terminal 321, and a gate terminal 322. As shown in FIG. 3, metal substrate 315 is bonded to metal substrate 325. Accordingly, device 330, which includes transistor 310 on metal substrate 315, is bonded to device 340, which includes transistor 320 on metal substrate 325. In an embodiment, the bonding process can be carried out using known die bonding or wafer bonding techniques, e.g., using physical or chemical bonding forces. For example, to allow electrical connections in the bonding, a conductive glue or epoxy can be used in some applications.

According to some embodiments of the present invention, three-dimensional device not only includes two semiconductor devices mechanically bonded together, it also can provide electrical connections between the devices. For example, an electrical connection is provided between the drain terminal 313 of the trench MOS transistor 310 and the drain terminal 323 of trench MOS transistor 320. This is further illustrated in FIG. 4.

Figure 4:
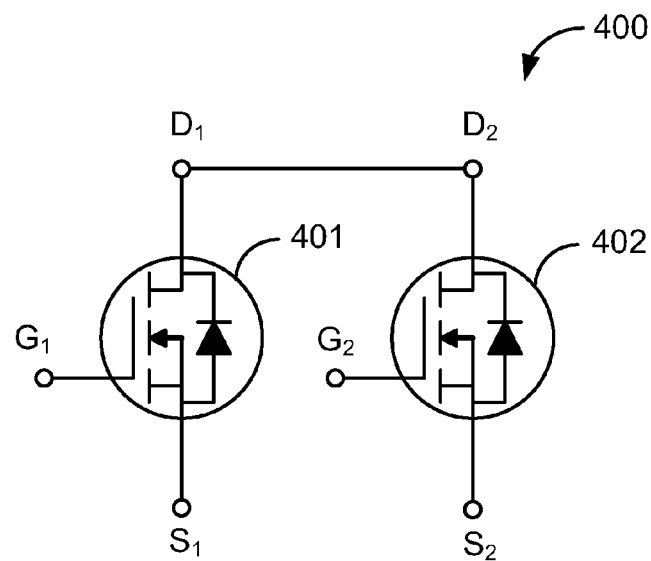
FIG. 4 is a simplified circuit schematic diagram for the three-dimensional semiconductor device 300 of FIG. 3 according to an embodiment of the present invention.

FIG. 4 is a simplified circuit schematic diagram for the three-dimensional semiconductor device 300 of FIG. 3 according to an embodiment of the present invention. As shown, device 400 FIG. 4 is a circuit schematic diagram of MOS device 300 of FIG. 3. For example, device 401 is a schematic representation of device 330 in FIG. 3, and similarly, device 402 is a schematic representation of device 340 in FIG. 3. As shown, device 401 has a drain terminal $D_1$, a source terminal $S_1$, and a gate terminal $G_1$, corresponding to drain terminal 313, source terminal 311, and gate terminal 312, respectively, in FIG. 3. Similarly, device 402 has a drain terminal $D_2$, a source terminal $S_2$, and a gate terminal $G_2$. Additionally, drain terminals $D_1$ and $D_2$ are connected together, reflecting the bonding of metal substrates 315 and 325 in FIG. 3. In a specific embodiment of the invention, device 400 can function as a NAND gate with two inputs at G1 and G2.

Figure 5:
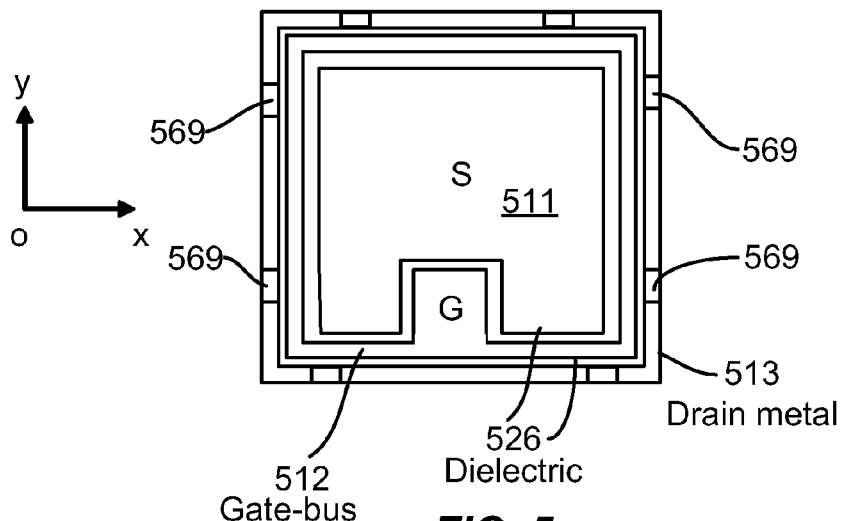
FIG. 5 a simplified top view diagram illustrating metal patterns of three-dimensional semiconductor device 300 of FIG. 3 according to a specific embodiment of the present invention.

FIG. 5 is a simplified top view diagram illustrating metal patterns of three-dimensional semiconductor device 300 of FIG. 3 according to a specific embodiment of the present invention. As shown, source metal 511, gate metal 512, and drain metal 513 are separated by dielectric 526. Also shown are locations some of the drain vias 569 which are used for external connections. More details can be seen in FIGS. 6 and 7 discussed below.

Figure 6:
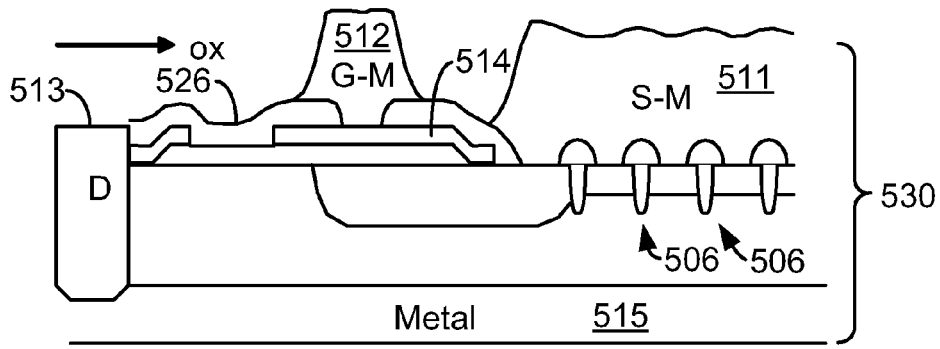
FIG. 6 is a simplified cross-sectional view of the device of FIG. 5 along the horizontal (ox) direction according to an embodiment of the present invention.
Figure 7:
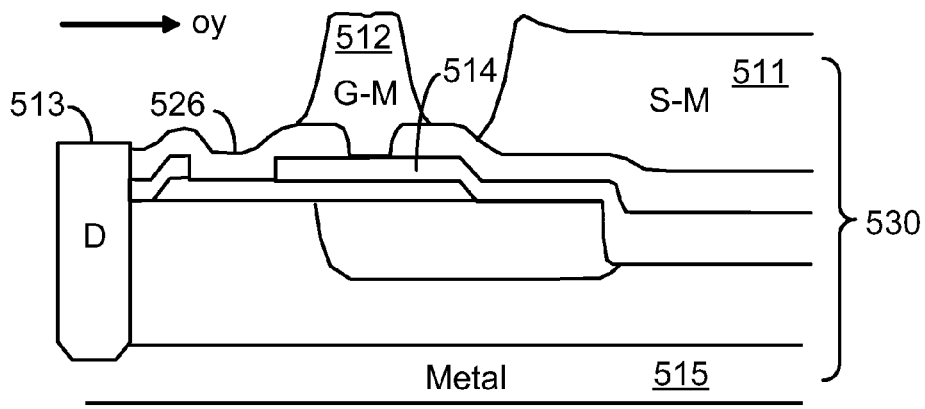
FIG. 7 is a simplified cross-sectional view of the device of FIG. 5 along the vertical (oy) direction according to an embodiment of the present invention.

FIGS. 6 and 7 are simplified cross-sectional view diagrams of the device of FIG. 5 along the horizontal (ox) direction and the vertical (oy) direction, respectively, according to an embodiment of the present invention. The (ox) cross section in FIG. 6 is taken across trench cells 506, whereas the (oy) cross section in FIG. 7 is taken along a trench cell. As shown, source metal 511, gate metal 512, and drain metal 513 are separated by dielectric 526. Also shown is conductive region D that connects the metal substrate 515 on the back side to the drain metal 513 on the front side. In FIG. 7, gate metal 512 is coupled to a gate conductor 514, which in turn is connected to the trench gate electrodes in the trench cells.

Although the above has been shown using a selected group of components for the device 300 as shown in FIGS. 3-7, there can be many alternatives, modifications, and variations. For example, some of the components may be expanded and/or combined. Other components may be inserted to those noted above. Depending upon the embodiment, the arrangement of components may be interchanged with others replaced. For example, in FIG. 3, device 300 is depicted as including two bonded trench MOS transistors. In some embodiments, the trench transistor can include trench gate MOSFET or shielded gate MOSFET. In other embodiments, device 300 can include other semiconductor devices, such as MOS or bipolar transistors. Additionally, even though the above discussion has centered on power devices, other devices, such as low voltage or logic devices can also be included. It is also noted that, in all the drawings, the components are drawn for illustrative purposes only and are not necessarily drawn to scale. Further details of these components are found throughout the present specification and more particularly below.

Figure 2:
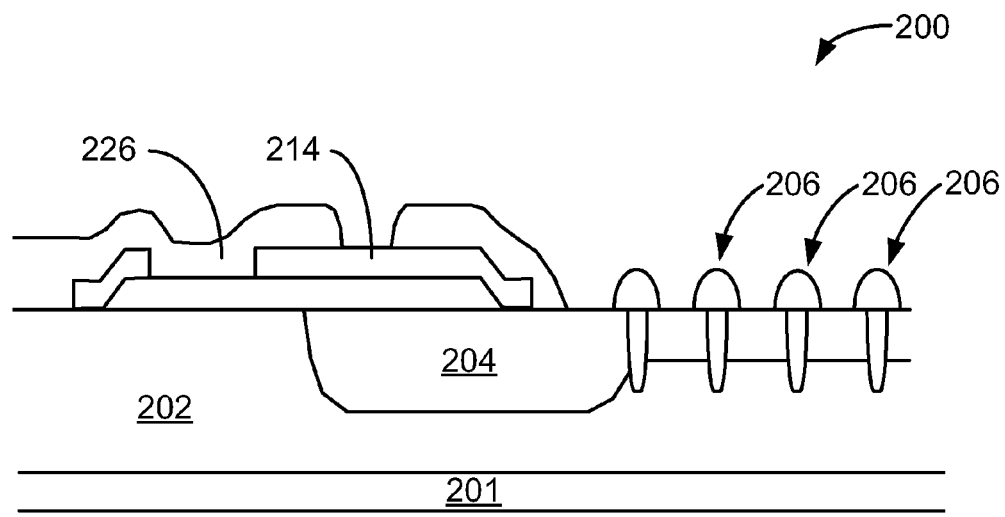
FIG. 2 is a simplified cross-sectional view diagram illustrating a trench MOSFET 200.
Figure 8A:
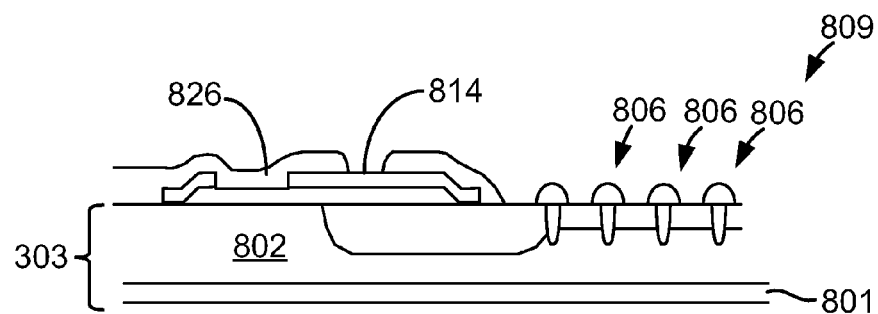
FIGS. 8A-8I are simplified cross-sectional view diagrams illustrating a method for making the three-dimensional semiconductor device 300 of FIG. 3 according to an embodiment of the present invention.

FIGS. 8A-8I are simplified cross-sectional view diagrams illustrating a method for making the three-dimensional semiconductor device 300 of FIG. 3 according to an embodiment of the present invention. These diagrams are merely examples, which should not unduly limit the scope of the claims herein. One skilled in the art would recognize other variations, modifications, and alternatives. The method starts in FIG. 8A by providing a trench MOSFET device structure 809 in and over a semiconductor substrate 303, including semiconductor regions 801 and 802. Similar to device 200 of FIG. 2, the trench MOSFET device structure in FIG. 8A includes one or more trench cells 806. Each of the trench cells includes a trench extending into the semiconductor substrate, a gate electrode in the trench, a source region adjacent to the top portion of the trench, and a drain region adjacent to the bottom portion of the trench. Also shown in FIG. 8A are gate electrode 814 and dielectric 826.

Figure 8B:
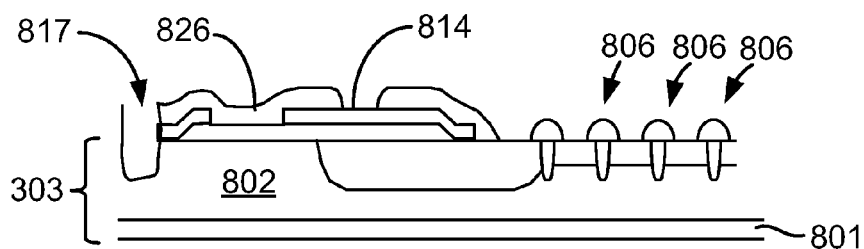
Figure 8C:
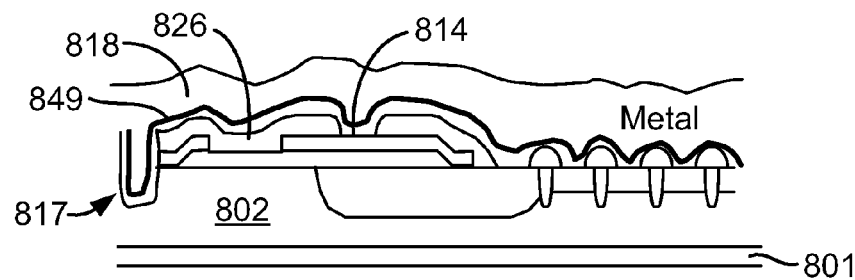
Figure 8D:
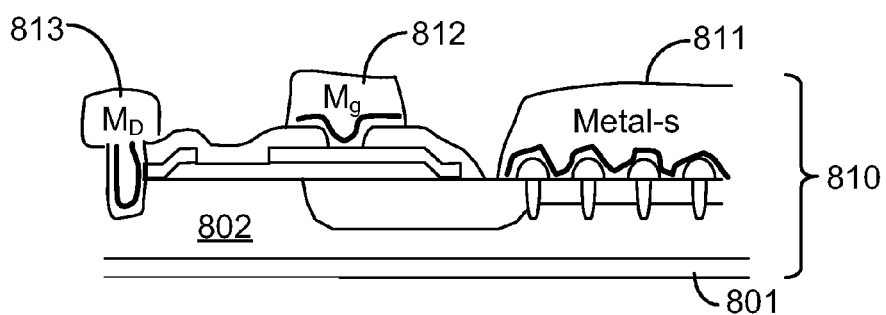

In FIG. 8B, a recess 817 is formed in a front portion of the substrate 803 and extends to a predetermined depth. The recess can be formed using know material removal techniques, including wet or dry etching, to remove a portion of the substrate and other materials that may overlie the substrate, e.g. a dielectric layer. In FIG. 8C, a metal layer 818 is formed over the first trench MOSFET device structure and filling the recess 817. In an embodiment, the metal layer 818 can include additional layers of conductive material 849, such as adhesive layer, contact metal layer, and barrier layer, etc. In FIG. 8D, the metal layer is patterned to form the drain terminal 813, the source terminal 811, and the gate terminal 812. The patterning can be carried out using known metal etching techniques. Note that drain terminal 813 overlies the recess region 817, and a portion of the drain terminal 813 is connected to the metal filling the recess 817.

Figure 8E:
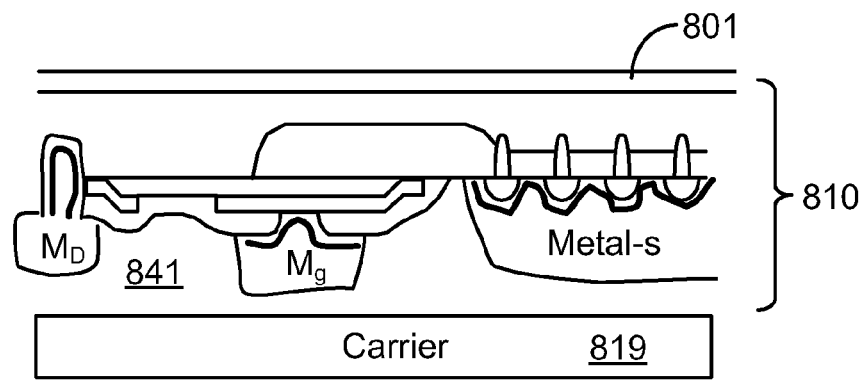

In FIG. 8D, trench MOS transistor device structure is designated as 810 and includes the drain terminal 813, the source terminal 811, and the gate terminal 812. In FIG. 8E, a carrier substrate 819 is attached to a front side of the trench MOSFET device structure 810. In an embodiment, a dielectric layer 841 is formed overlying the front side of device 810 and planarized. In a specific embodiment, before the carrier substrate 819 is attached, the device 810 is thinned from the back side to an appropriate thickness using known thinning techniques such as chemical mechanical polishing, grinding, etching, or combination of these techniques.

Figure 8F:
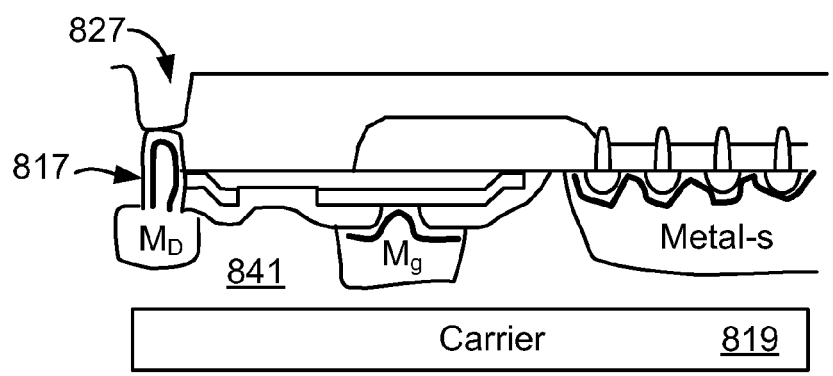
Figure 8G:
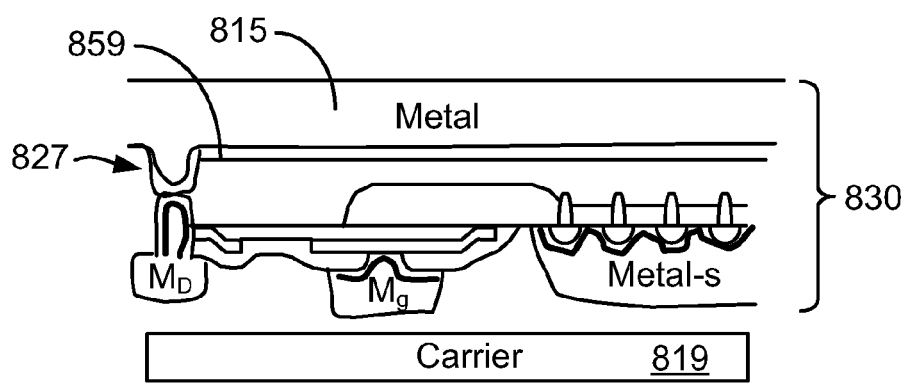

In FIG. 8F, a second recess 827 is formed in on the back side of the substrate. As shown, the second recess 827 is substantially aligned to the first recess 817. Moreover, the second recess 827 exposes the drain metal in the first recess 817. Then a second metal layer 815 is formed overlying the back side of the substrate as shown in FIG. 8G. Optionally, metal layer 815 can include additional metal layers such as 859, similar to 849 in FIG. 8C. The second metal layer filling the second recess 827 and forms the first metal substrate for device structure 830.

In FIG. 8G, device structure 830 is shown to include trench MOS transistor on a first metal substrate 815 attached to a carrier substrate 819. The trench MOS transistor includes a drain terminal, a source terminal, and a gate terminal on a front side opposite the first metal substrate, with the drain terminal being electrically coupled to first metal substrate 815. A second device structure can be formed using the method described above. The second device can then be bonded to form a three-dimensional device.

Figure 8H:
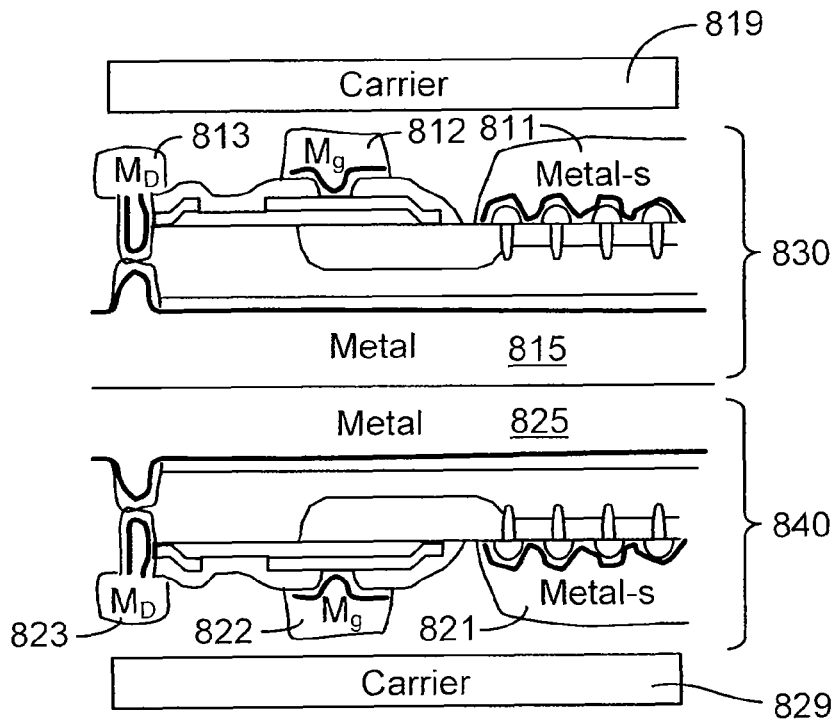
Figure 8I:
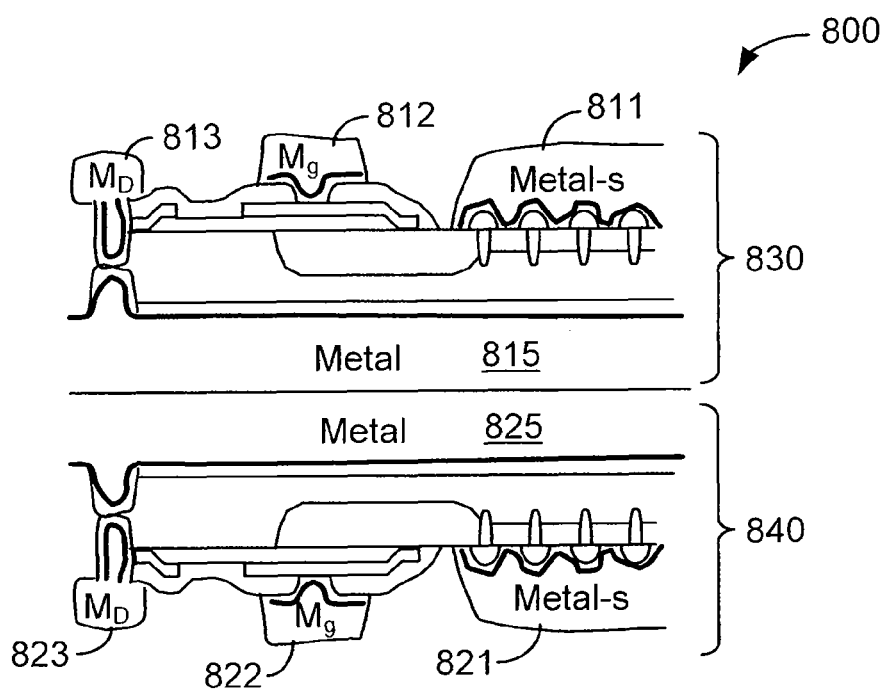

FIG. 8H shows two devices bonded together according to an embodiment of the invention. Device 830 and device 840 are formed using the method described above. Device structure 830 includes a trench MOS transistor on metal substrate 815, and a carrier substrate 819 is attached to Device 830. Similarly, device structure 840 includes a trench MOS transistor on a second metal substrate 825, and is attached to a second carrier substrate 829. In FIG. 8H, the first metal substrate 815 is bonded with the second metal substrate 825. The bonding process can be carried out using known techniques, e.g. by physical or chemical bonding forces. For example, a conductive glue or epoxy can be used in some applications. Since conductive material is involved in the bonding, an electrical contact is formed between the drain terminal 813 of the first trench MOS transistor and the drain terminal 823 of the second trench MOS transistor. In FIG. 8I, the carrier substrates 819 and 829 are removed, leaving a stacked three-dimensional trench MOS device 800. Note that device 800 is substantially identical to device 300 as shown in FIG. 3.

The above sequences of processes provides methods for forming bonded devices according to embodiments of the present invention. As shown, the methods use a combination of processes including a way of connecting a back side metal to a front side electrode and bonding the back side metal of two devices to form a stacked device having a specific electrical connection. Other alternatives can also be provided where steps are added, one or more steps are removed, or one or more steps are provided in a different sequence without departing from the scope of the claims herein. Additionally, even though trench MOS devices have been used in the discussion, it is understood that the techniques provided herein are applicable to other semiconductor devices as well. Further details of the present method can be found throughout the present specification.

Figure 9:
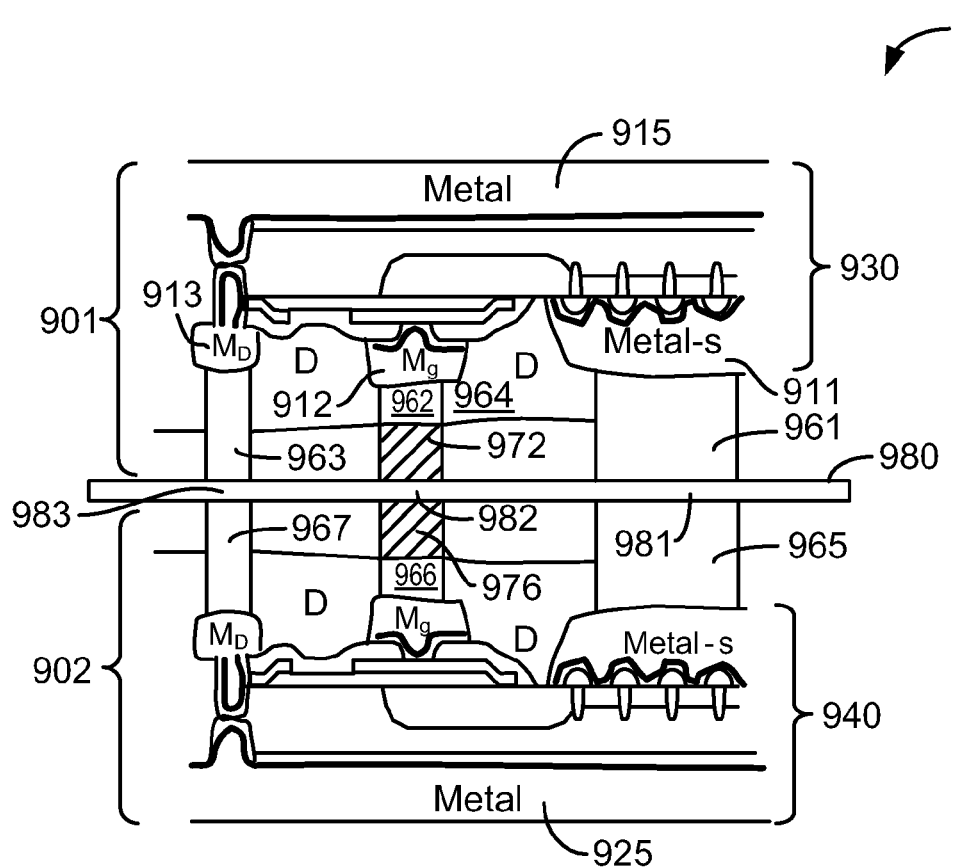
FIG. 9 is a simplified cross-sectional view diagram illustrating a three-dimensional semiconductor device 900 according to an embodiment of the present invention.

FIG. 9 is a simplified cross-sectional view diagram illustrating a three-dimensional semiconductor device 900 according to an embodiment of the present invention. This diagram is merely an example, which should not unduly limit the scope of the claims herein. One of ordinary skill in the art would recognize other variations, modifications, and alternatives. Additionally, the cross-sectional view diagram in FIG. 9 is intended for illustrating various device features, and all the features may not necessarily be present in any single cross-sectional cut of the device. As shown, three-dimensional semiconductor device 900 includes two devices 901 and 902 bonded together using a patterned conductive layer 980. It can be seen in FIG. 9 that device 901 is positioned upside down. Device 901 includes a trench MOS transistor 930, which is similar to device 830 in FIG. 8G described above and includes a semiconductor region on a first metal substrate 915. The trench MOS transistor 930 includes a drain terminal 913, a source terminal 911, and a gate terminal 912 on a front side of the semiconductor region opposite the metal substrate 915. The trench MOS transistor 930 also includes a conductive region filling a void in the semiconductor region. The conductive region connects the drain terminal to the metal substrate 915.

In a specific embodiment, device 901 also includes a dielectric layer 964 covering trench MOS transistor 930. Additionally, a plurality of conductors fill a corresponding plurality of openings in the dielectric layer. The plurality of conductors includes at least a first conductor 963 coupled to the drain terminal 913, at least a second conductor 961 coupled to the source terminal 911, and at least a third conductor 962 coupled to the gate terminal 912.

In FIG. 9, device 902 is similar to device 901 and includes a trench MOS transistor 940, which is similar to device 830 in FIG. 8G described above. Device 902 includes a semiconductor region on a metal substrate 925. Trench MOS transistor 940 has similar device features as trench MOS transistor 930 discussed above. In a specific embodiment, device 902 also includes at least a first conductor 967 coupled to its drain terminal, at least a second conductor 965 coupled to its source terminal, and at least a third conductor 966 coupled to its gate terminal.

As shown in FIG. 9, three-dimensional semiconductor device 900 also includes a patterned metal layer 980 bonded to devices 901 and 902. The patterned metal layer includes at least a first region 983, a second region 981, and a third region 982. As discussed below in connection with FIGS. 14A-14M below, conductive regions 981, 982, and 983 are interconnected when metal film 980 is used in the bonding process. After the bonding, portions of the patterned metal layer 980 are removed to separate the conductive regions 981, 982, and 983. In an embodiment, the first region 983 is in electrical contact with the drain terminals of the first and the second trench MOS transistors. The second region 981 is in electrical contact with the source terminals of the first and the second trench MOS transistors. The third region 982 is in electrical contact with the gate terminals of the first and the second trench MOS transistors.

In the embodiment shown in FIG. 9, the first region 983 of the patterned metal layer 980 is bonded to conductor 963 of device 901 and conductor 967 of trench MOS transistor 902. The second region 981 of the patterned metal layer 980 is bonded to conductor 961 of device 901 and conductor 965 of trench MOS transistor 902. In one embodiment, the third region 982 of the patterned metal layer 980 is bonded to conductor 962 of device 901 and conductor 966 of trench MOS transistor 902 to connect the gate terminals. The connections to region 982 are not shown in this cross-section. In FIG. 9, the patterned conductive layer 980 is isolated from the third conductors 962 and 966 by dielectrics 972 and 976, respectively. In this configuration, the drain terminals of transistors 930 and 940 are connected together. Similarly, the sources terminals of transistors 930 and 940 are connected together, and the drain terminals of transistors 930 and 940 are connected together. Accordingly, device 900 functions as a parallel combination of two transistors in this specific example. This is further depicted in FIG. 10 discussed below.

Figure 10:
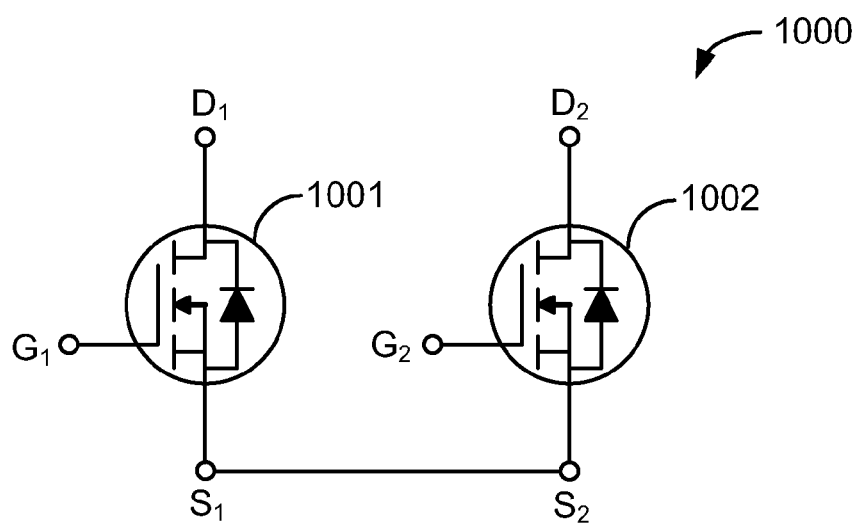
FIG. 10 is a simplified schematic diagram illustrating the three-dimensional semiconductor device 900 of FIG. 9 according to an embodiment of the present invention.

FIG. 10 is a simplified circuit schematic diagram for the three-dimensional semiconductor device 900 of FIG. 9 according to an embodiment of the present invention. As shown, device 1000 FIG. 10 is a circuit schematic diagram of MOS device 900 of FIG. 9. For example, device 1001 is a schematic representation of device 901 in FIG. 9, and similarly, device 1002 is a schematic representation of device 902 in FIG. 9. As shown, device 1001 has a drain terminal $D_1$, a source terminal $S_1$, and a gate terminal $G_1$, corresponding to drain terminal 913, source terminal 911, and gate terminal 912, respectively, in FIG. 9. Similarly, device 1002 has a drain terminal $D_2$, a source terminal $S_2$, and a gate terminal $G_2$. Source terminals $S_1$ and $S_2$ are shown to be connected together. In a specific embodiment of the invention, with gate terminals $G_1$ and $G_2$ connected together and drain terminals and connected together, device 1000 can function as a parallel combination of two devices.

Even though a parallel combination of two devices has been discussed. This is merely an example. In other embodiments, different configurations may be achieved. In other embodiments, the terminals of the two devices can be connected in a variety of ways, depending on the pattern in the metal layer 980 and the configuration of conductors 961-963 and 965-967 in FIG. 9. For example, any of the terminals of device 901 can be connected to any of the terminals of device 902. Additionally, an external contact can be provided to a specific terminal of device 901 or 902. Of course, there can be other variations, modifications, and alternatives.

Figure 11:
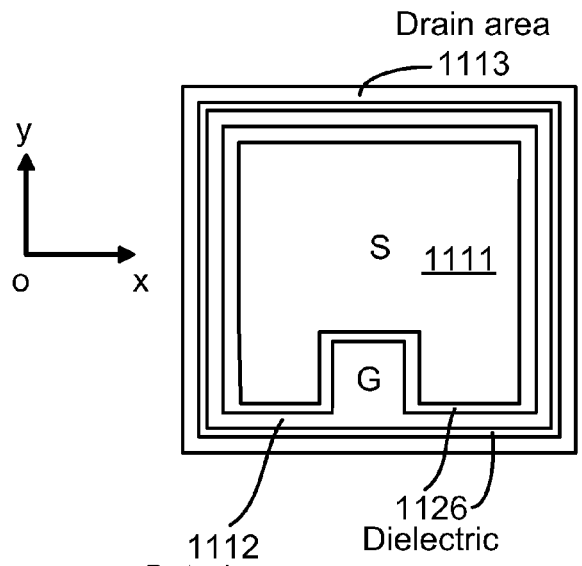
FIG. 11 a simplified layout diagram illustrating metal patterns of a trench MOSFET in device 900 of FIG. 9 according to a specific embodiment of the invention.

FIG. 11 a simplified top view diagram illustrating metal patterns of a trench MOSFET in device 900 of FIG. 9 according to a specific embodiment of the present invention. As shown, source metal 1111, gate metal 1112, and drain metal 1113 are separated by dielectric 1126. More details can be seen in FIGS. 12 and 13 discussed below.

Figure 12:
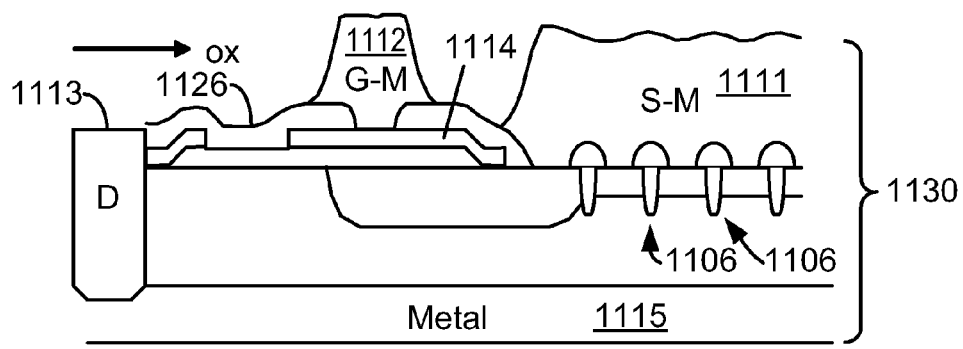
FIG. 12 is a simplified cross-sectional view of the device of FIG. 10 along the horizontal (ox) direction according to an embodiment of the present invention.
Figure 13:
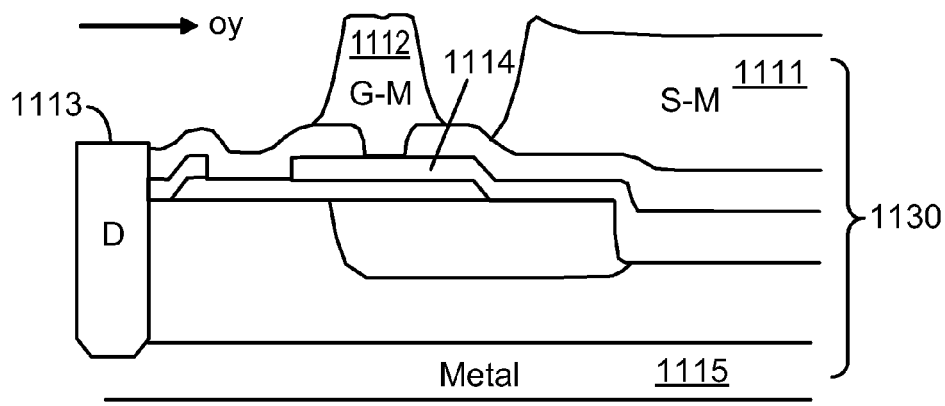
FIG. 13 is a simplified cross-sectional view of the device of FIG. 10 along the vertical (oy) direction according to an embodiment of the present invention.

FIGS. 12 and 13 are simplified cross-sectional view diagrams of the device of FIG. 11 along the horizontal (ox) direction and the vertical (oy) direction, respectively, according to an embodiment of the present invention. The (ox) cross section in FIG. 12 is taken across trench cells 1106, whereas the (oy) cross section in FIG. 8 is taken along a trench cell. As shown, source metal 1111, gate metal 1112, and drain metal 1113 are separated by dielectric 1126. Also shown is conductive region D formed to connect the metal substrate 1115 on the back side to the drain metal 1113 on the front side. In FIG. 7, gate metal 1112 is coupled to a gate conductor 1114, which in turn is connected to trench gate electrodes in trench cells.

Although the above has been shown using a selected group of components for the device 900 as shown in FIGS. 9-13, there can be many alternatives, modifications, and variations. For example, some of the components may be expanded and/or combined. Other components may be inserted to those noted above. Depending upon the embodiment, the arrangement of components may be interchanged with others replaced. For example, in FIG. 9, device 900 is depicted as including two bonded trench MOS transistors. In some embodiments, the trench transistor can include trench gate MOSFET or shielded gate MOSFET. In other embodiments, device 900 can include other semiconductor devices, such as MOS or bipolar transistors. Additionally, even though the above discussion has centered on power devices, other devices, such as low voltage or logic devices can also be included in some embodiments. It is also noted that the components are drawn for illustrative purposes only and are not necessarily drawn to scale. Further details of these components are found throughout the present specification and more particularly below.

Figure 14A:
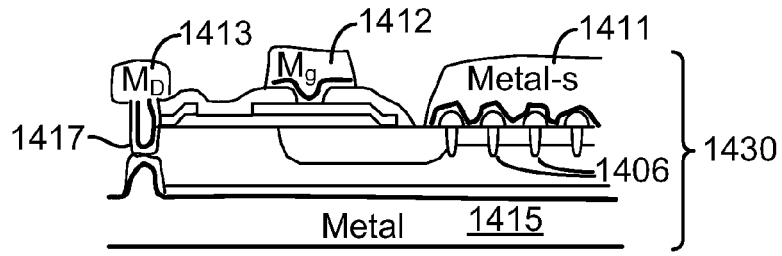
FIGS. 14A-14L are simplified cross-sectional view diagrams illustrating a method for making the three-dimensional semiconductor device 300 of FIG. 3 according to an embodiment of the present invention.

FIGS. 14A-14L are simplified cross-sectional view diagrams illustrating a method for making the three-dimensional semiconductor device 900 of FIG. 9 according to an embodiment of the present invention. These diagrams are merely examples, which should not unduly limit the scope of the claims herein. One skilled in the art would recognize other variations, modifications, and alternatives. As shown in FIG. 14A, the method includes providing a trench MOS transistor 1430, which is similar to device 830 in FIG. 8G described above. Device 1430 includes a semiconductor region on a first metal substrate 1415. The trench MOS transistor 1430 includes a drain terminal 1413, a source terminal 1411, and a gate terminal 1412 on a front side of the semiconductor region opposite the metal substrate 1415. The trench MOS transistor 1430 also includes a conductive region filling a void 1417 in the semiconductor region and connecting the drain terminal 1413 to the metal substrate 1415.

FIGS. 14B-14G illustrate a process for forming a plurality of conductors coupled to the trench MOS transistor 1430. In an embodiment, at least a first conductor is coupled to the drain terminal 1413, at least a second conductor is coupled to the source terminal 1411, and at least a third conductor is coupled to the gate terminal 1412.

Figure 14B:
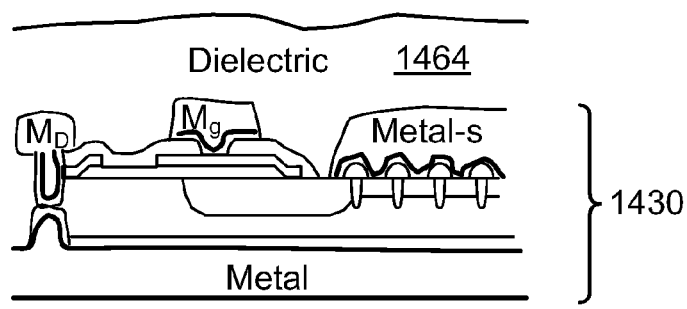
Figure 14C:
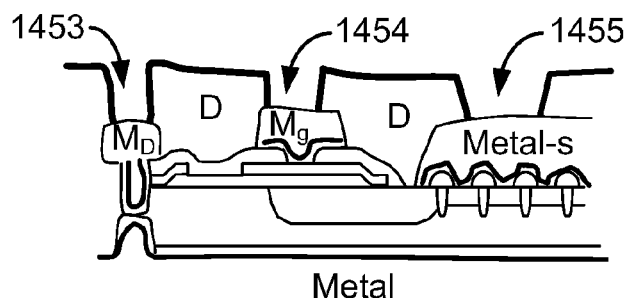
Figure 14D:
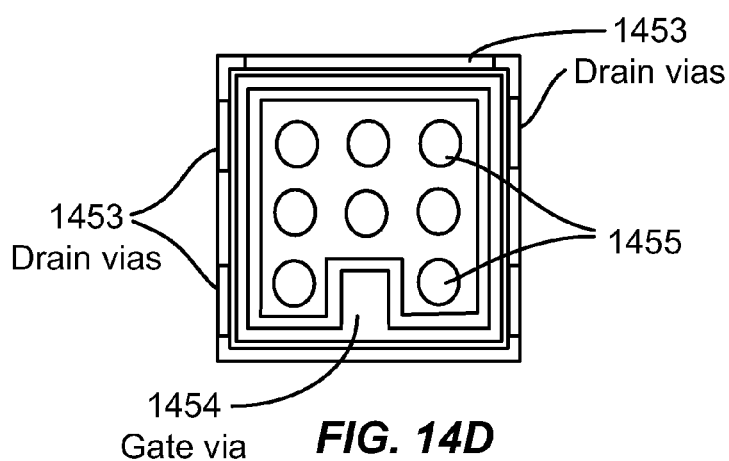
Figure 14E:
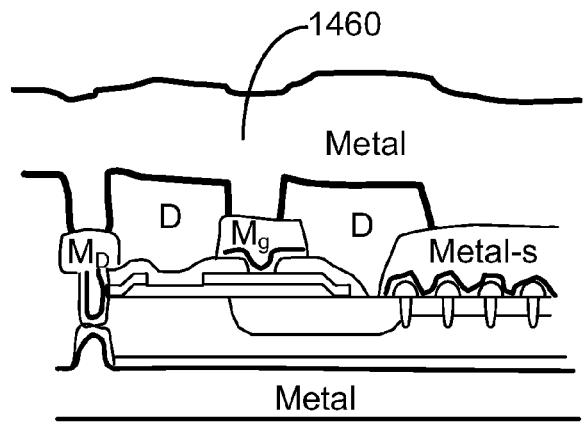
Figure 14F:
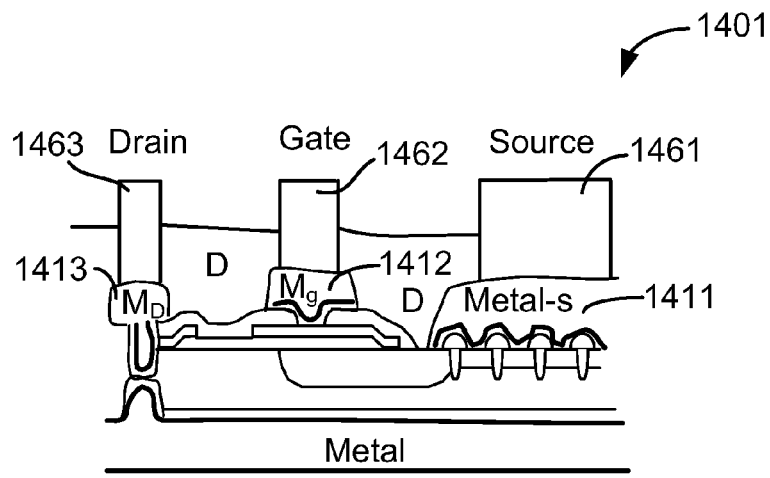
Figure 14G:
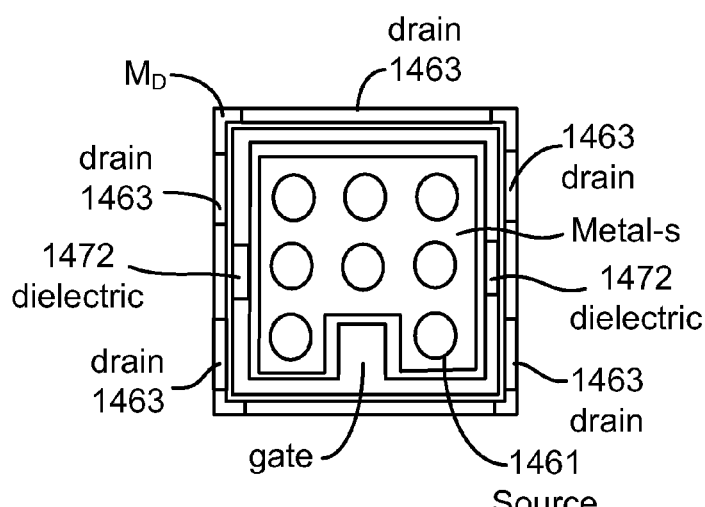

In FIG. 14B, a dielectric layer 1464 is formed overlying the trench MOS transistor 1430. In FIG. 14C, dielectric layer 1451 is patterned to form openings, such as drain vias 1453, source via 1455, and gate via 1454 to expose a portion of the drain terminal, a portion of the source terminal, and a portion of the gate terminal, respectively. FIG. 14 D shows the pattern of openings or vias formed in dielectric layer 1464 according to a specific embodiment of the invention. In FIG. 14E, a conductive layer 1460 is formed overlying the patterned dielectric layer. In FIG. 14F, the conductive layer 1460 is patterned to form a plurality of conductors in the openings in the dielectric layer. For example, conductor 1463 is coupled to the drain terminal 1413, conductor 1461 is coupled to the source terminal 1411, and conductor 1462 is coupled to the gate terminal 1412. The device in FIG. 14F, designated as 1401, is now ready to be used as a component in a bonding process according to an embodiment of the invention. FIG. 14G is a top view of device 1401 showing the pattern of conductors 1461, 1462, and 1463 formed according to a specific embodiment of the invention. As discussed above, each of the conductors is coupled to a device terminal. In FIG. 14G, dielectric regions 1472 overlie portions of the gate bus and isolate the gate bus from the external source contact illustrated in FIG. 14M.

Figure 14H:
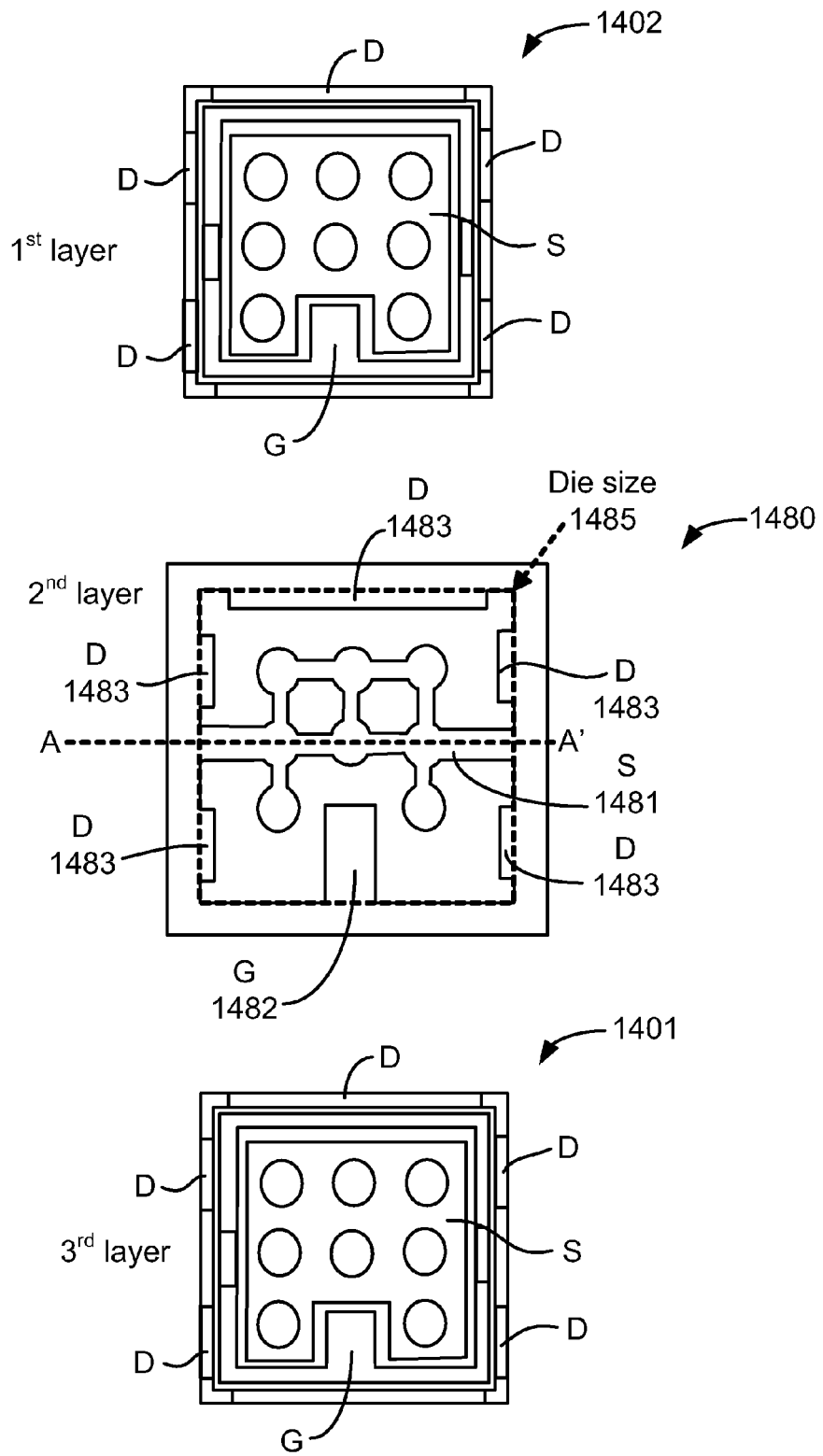

FIG. 14H includes simplified top view diagrams showing three components to be used in a bonding process to form the stacked three-dimensional semiconductor device according to an embodiment of the present invention. Devices 1401 and 1402 in FIG. 14H are similar to device 1401 of FIG. 14F. That is, each of devices 1401 and 1402 includes a trench MOS transistor on a metal substrate, and further includes a drain terminal, a source terminal, and a gate terminal on a front side opposite the second metal substrate. Additionally, the drain terminal is electrically coupled to the metal substrate.

FIG. 14H also shows a patterned metal layer 1480 having interconnected regions, such as 1481, 1482, and 1483. In a specific embodiment, metal layer 1480 is shown to be larger than the die size of device 1401 and 1402, which is marked by dotted line boundary 1485. The portion of metal layer 1480 outside the die size line provides interconnections of the various regions. Metal layer 1480 can be a patterned metal thin film suitable for bonding applications and fabricated using known methods. For example, in a specific embodiment, metal layer 1480 can be made using lead-frame techniques. As can be seen in FIG. 14H, the pattern of regions 1481, 1482, and 1483 is designed to match the patterns of conductors in device 1401 and 1402.

Figure 14I:
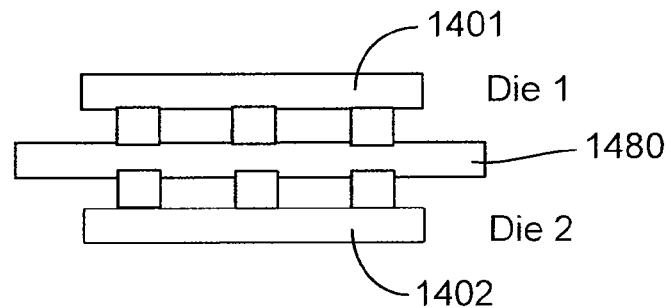
Figure 14J:
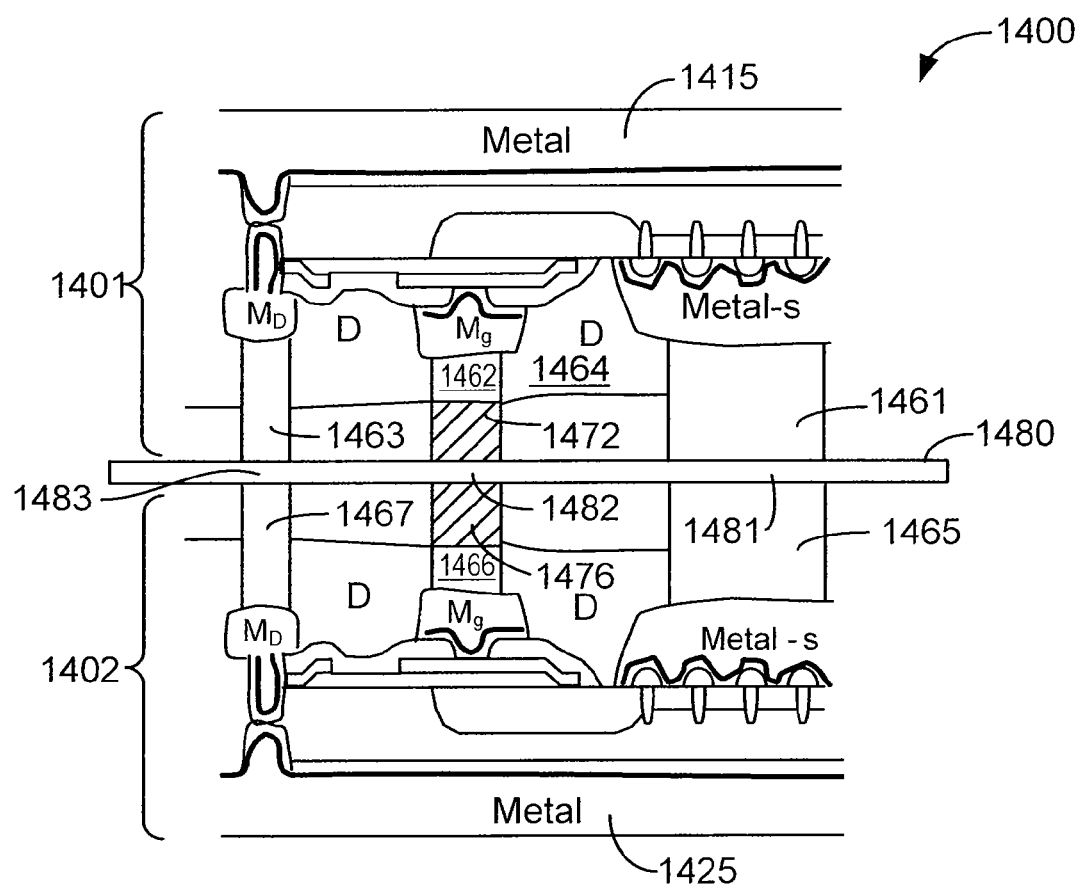

In FIG. 14I, the patterned metal layer 1480 is bonded to the device 1401 and device 1402 to form a stacked three-dimensional semiconductor device. FIG. 14J shows details of the bonding according to a specific embodiment of the invention. As shown, region 1483 of metal layer 1480 is bonded to conductor 1463 and conductor 1467 and also provides electrical contact between the drain terminals of devices 1401 and 1402. Similarly, region 1481 is bonded to conductor 1461 and conductor 1465 and also provides electrical contact between the source terminals of devices 1401 and 1402. In one embodiment, region 1482 is bonded to conductor 1462 and conductor 1466, and also provides electrical contact between the gate terminals of devices 1401 and 1402. The connections to region 1482 are not shown in this cross-section. In FIG. 14J, the patterned conductive layer 1480 is isolated from conductors 1462 and 1466 by dielectrics 1472 and 1476, respectively.

Figure 14K:
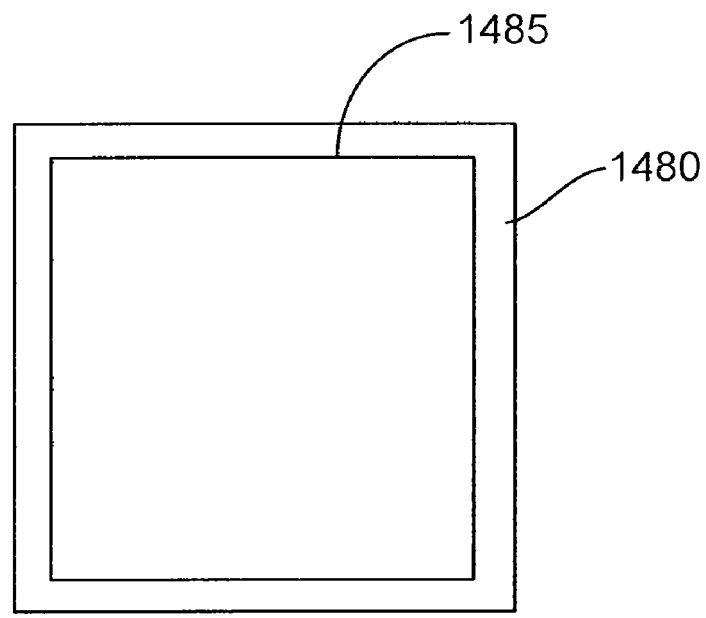
Figure 14L:
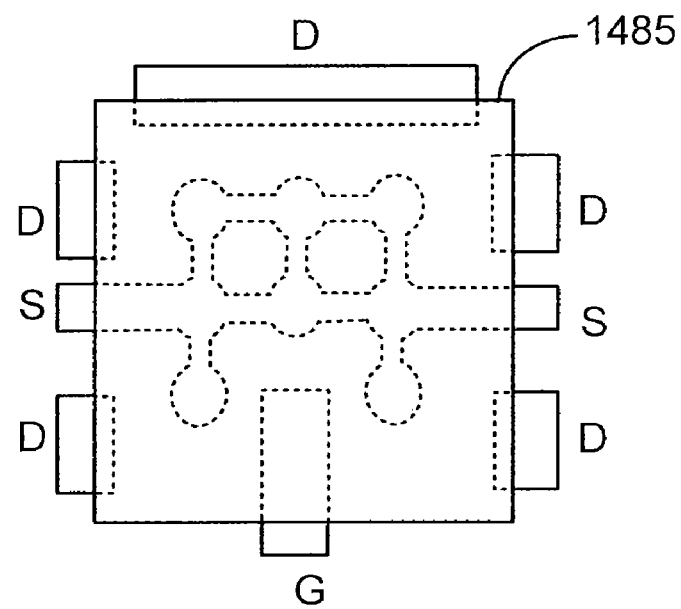

FIG. 14K is a simplified top outline view of the bonded three-dimensional device 1400 in FIG. 14J. In FIG. 14K, metal layer 1480 is larger than die size boundary 1485. As discussed above in connection with FIG. 14H, the portion of metal layer 1480 outside the die size line provides interconnection of the various regions during the bonding process. As shown in FIG. 14L, after the bonding process, portions of the patterned metal layer 1480 are selectively removed to separate the conductive regions and to provide external contacts for the three-dimensional semiconductor device. As shown, regions D provide contacts to drain terminals of the devices, regions S provide contacts to source terminals of the devices, and region G provide contact to gate terminal of the devices.

The above sequences of processes provide methods for forming bonded devices according to embodiments of the present invention. As shown, the methods use a combination of processes including providing a patterned conductive layer for bonding two devices to form a stacked device having specific electrical connections. Other alternatives can also be provided where steps are added, one or more steps are removed, or one or more steps are provided in a different sequence without departing from the scope of the claims herein. For example, depending on the embodiments, the terminals of the two devices can be connected in a variety of ways, depending on the pattern in the metal layer, e.g., 1480 in FIG. 14H and the configuration of the conductors used in the bonding process. Additionally even though trench MOS devices have been used in the discussion, it is understood that the techniques provided herein are applicable to other semiconductor devices as well. Further details of the present method can be found throughout the present specification.

Figure 15:
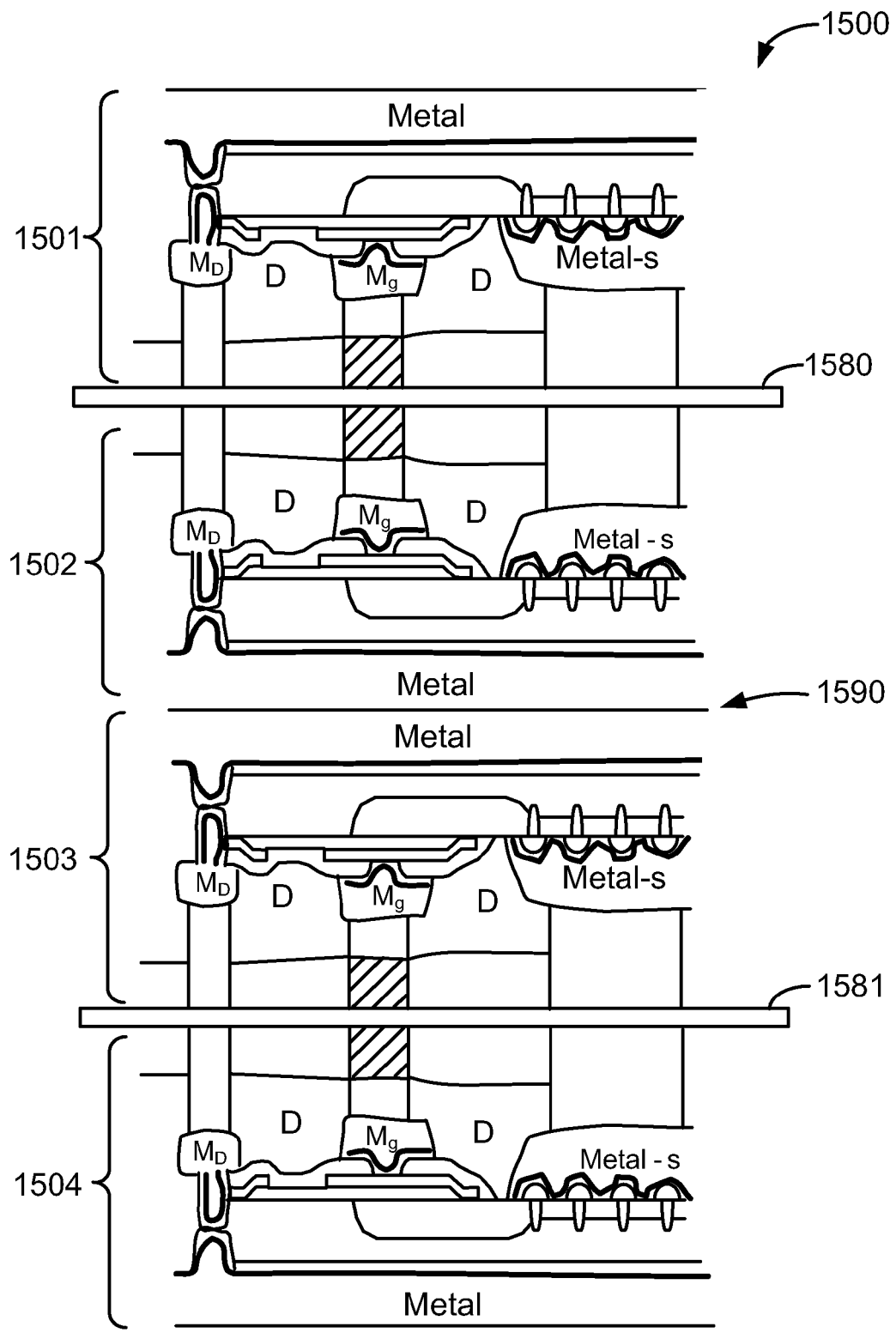
FIG. 15 is a simplified cross-sectional view diagram illustrating a three-dimensional semiconductor device 1500 according to another embodiment of the present invention.

FIG. 15 is a simplified cross-sectional view diagram illustrating a three dimensional semiconductor device 1500 according to another embodiment of the present invention. The methods and device structures discussed above, e.g., in FIGS. 8A-8J and FIGS. 14A-14M, can be combined to form various three-dimensional semiconductor devices. As shown in FIG. 15, device 1500 includes a first semiconductor device 1501 on a first substrate and including a first plurality of terminals, and a second semiconductor device 1502 on a second substrate and including a second plurality of terminals. Device 1501 and device 1502 are bonded together to form a device similar to device 900 of FIG. 9. A first patterned conductive layer 1580 is disposed between the first and the second semiconductor devices. The first patterned conductive layer 1580 includes a plurality of conductive regions, and each of the conductive regions being bonded to a conductor coupled to one of the first plurality of terminals and bonded to another conductor coupled to one of the second plurality of terminals.

Device 1500 also includes a third semiconductor device 1503 on a third substrate and including a third plurality of terminals, and a fourth semiconductor device 1504 on a fourth substrate and including a fourth plurality of terminals. Device 1503 and 1504 are bonded together, similar to device 900 of FIG. 9. A second patterned conductive layer 1581 is disposed between the third and the fourth semiconductor devices. The second patterned conductive layer 1581 includes a plurality of conductive regions, and each of the conductive regions is bonded to a conductor coupled to one of the third plurality of terminals and another conductor coupled to one of the fourth plurality of terminals.

Additionally, the substrate of device 1502 is bonded to the substrate of device 1503. This bonding is shown as 1590 in FIG. 15. As shown, device 1500 includes devices 1501, 1502, 1503, and 1504 bonded together. The functionality of three-dimensional device 1500 can be varied depending on the patterns of conductive regions in conductive layers 1580 and 1581. Moreover, techniques described in FIGS. 8A-8J and FIGS. 14A-14M can be used repeatedly to form three-dimensional device structures having more than the four devices shown in FIG. 15.

Figure 16:
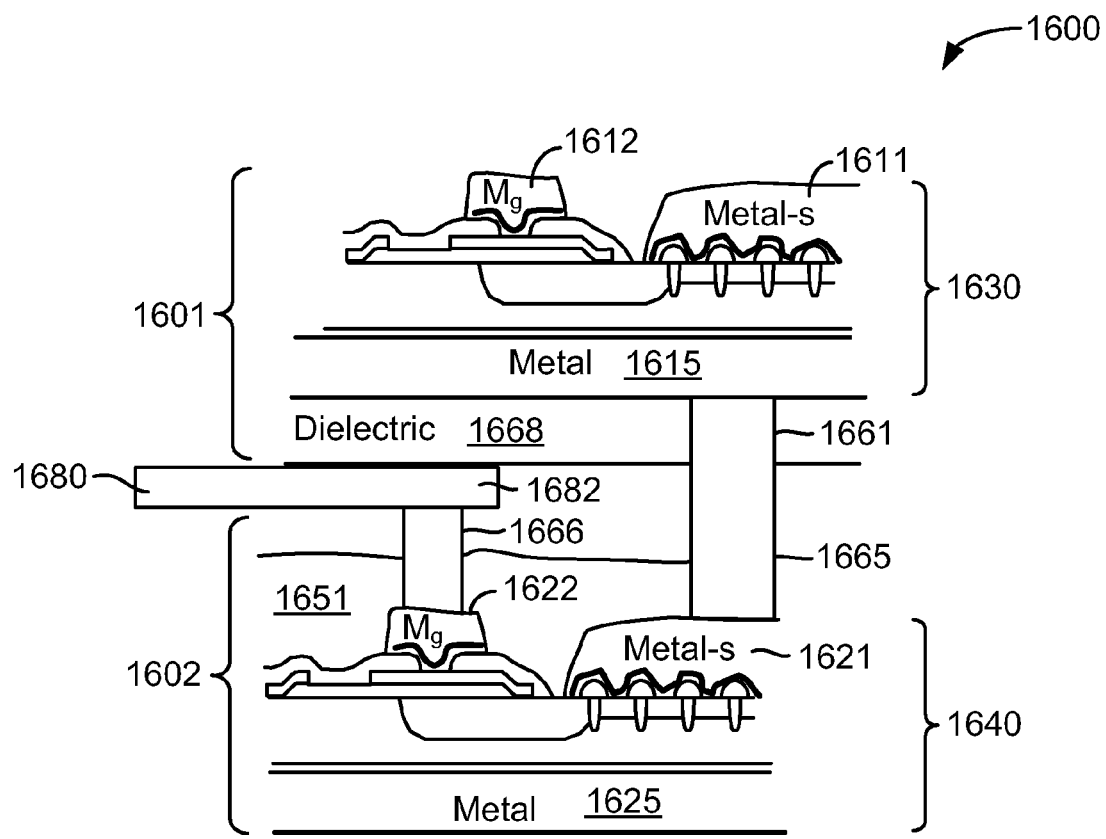
FIG. 16 is a simplified cross-sectional view diagram illustrating a three-dimensional semiconductor device according to yet another embodiment of the present invention.

FIG. 16 is a simplified cross-sectional view diagram illustrating a three-dimensional semiconductor device 1600 according to yet another embodiment of the present invention. This diagram is merely an example, which should not unduly limit the scope of the claims herein. One of ordinary skill in the art would recognize other variations, modifications, and alternatives. Additionally, the cross-sectional view diagram in FIG. 16 is intended for illustrating various device features, and all the features may not necessarily be present in any single cross-sectional cut of the device. As shown, three-dimensional semiconductor device 1600 includes two devices 1601 and 1602 bonded together using a patterned conductive layer 1680 and conductors 1661 and 1665. Device 1601 includes a trench MOS transistor 1630, which is similar to device 830 in FIG. 8G described above, and includes a semiconductor region on a first metal substrate 1615. The trench MOS transistor 1630 includes a source terminal 1611 and a gate terminal 1612 on a front side of the semiconductor region opposite the metal substrate 1615. The metal substrate 1615 also functions as a drain terminal for the trench MOS transistor 1630. In a specific embodiment, device 1601 also includes a dielectric layer 1668 formed on the back side of metal substrate 1615, and a conductor 1661 coupled to the back side of metal substrate 1615.

As shown in FIG. 16, device 1602 is similar to device 1601 and includes a trench MOS transistor 1640, which is similar to device 830 in FIG. 8G described above and includes a semiconductor region on a first metal substrate 1625. Trench MOS transistor 1640 has similar device features as trench MOS transistor 1630 discussed above. In a specific embodiment, device 1602 also includes at least a conductor 1665 coupled to its source terminal 1621 and at least a conductor 1666 coupled to its gate terminal 1622. The metal substrate 1625 also functions as a drain terminal for the trench MOS transistor 1630.

As shown in FIG. 16, three-dimensional semiconductor device 1600 also includes a patterned metal layer 1680 bonded to devices 1601 and 1602. The patterned metal layer includes at least a region 1682 for bonding and for providing external contact. As shown, region 1682 is in electrical contact with the gate terminal 1622 of trench MOS transistors 1640.

In the embodiment shown in FIG. 16, region 1682 of the patterned metal layer 1680 is bonded to conductor 1666 of device 1602. Additionally, conductor 1661 is bonded to conductor 1665. In this configuration, the drain terminal 1615 of transistor 1630 is coupled to the source terminal 1621 of transistor 1640. Accordingly, device 1600 functions as a series combination of two transistors. This is further depicted in FIG. 17 discussed below.

Figure 17:
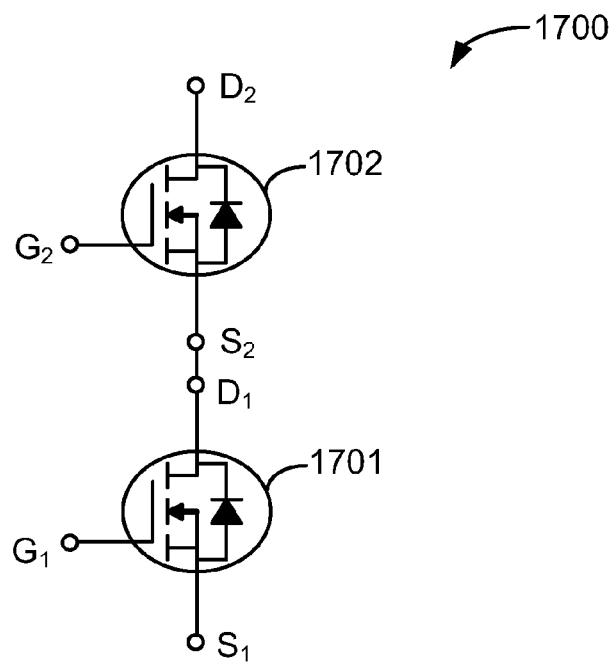
FIG. 17 is a simplified schematic diagram illustrating the three-dimensional semiconductor device 1600 of FIG. 16 according to an embodiment of the present invention.

FIG. 17 is a simplified circuit schematic diagram for the three-dimensional semiconductor device 1600 of FIG. 16 according to an embodiment of the present invention. As shown, device 1700 FIG. 17 is a circuit schematic diagram of MOS device 1600 of FIG. 16. For example, device 1701 is a schematic representation of device 1601 in FIG. 16, and similarly, device 1702 is a schematic representation of device 1602 in FIG. 16. As shown, device 1701 has a drain terminal $D_1$, a source terminal $S_1$, and a gate terminal $G_1$, corresponding to drain terminal 1615, source terminal 1611, and gate terminal 1612, respectively, in FIG. 16. Similarly, device 1702 has a drain terminal $D_2$, a source terminal $S_2$, and a gate terminal $G_2$ corresponding to drain terminal 1625, source terminal 1621, and gate terminal 1622, respectively, in FIG. 16. As shown, source terminals $S_1$ and drain terminal $D_2$ are connected together. In a specific embodiment of the invention, device 1700 can function as series combination of devices 1701 and 1702.

Even though a series combination of two devices has been discussed, this is merely an example. In some embodiments, different configurations may be achieved. In other embodiments, the terminals of the two devices can be connected in a variety of ways, depending on the pattern in the metal layer 1680 in FIG. 16 and the configuration of conductors using in the bonding process. For example, the gate terminal of device 1602 can be coupled to the drain terminal of device 1601. Additionally, external contacts can be provided to specific terminals of device 1601 or 1602. Of course, there can be other variations, modifications, and alternatives.

Figure 18:
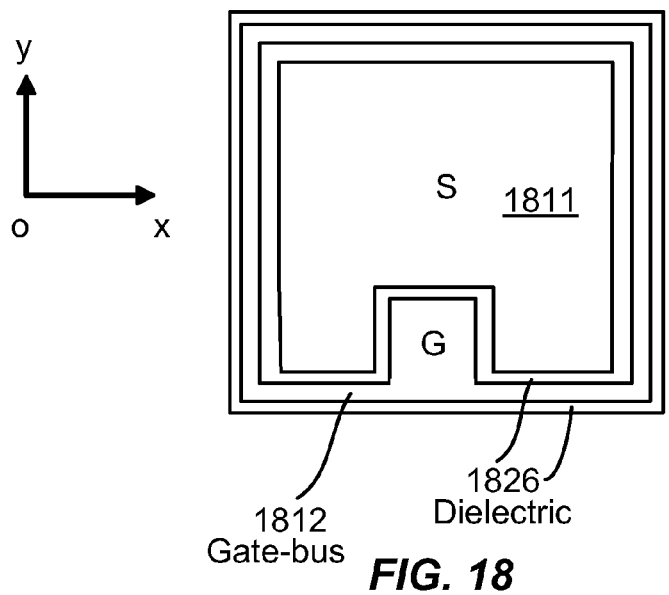
FIG. 18 a simplified layout diagram illustrating metal patterns in a three-dimensional semiconductor device 1600 of FIG. 16 according to a specific embodiment of the present invention.
Figure 19:
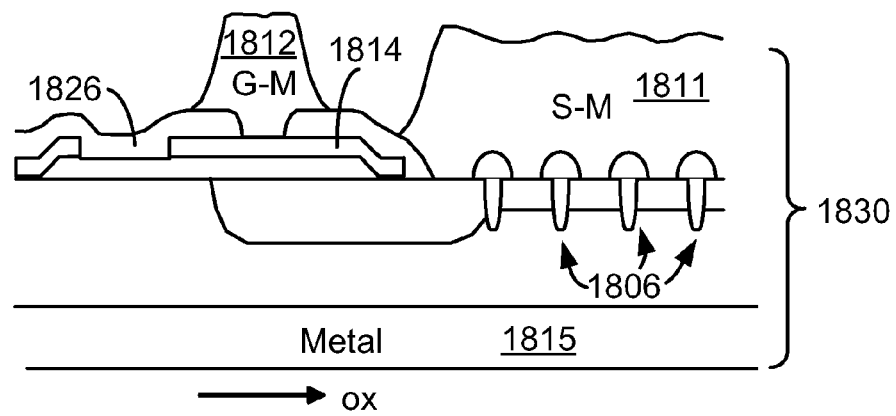
FIG. 19 is a simplified cross-sectional view of the device of FIG. 18 along the horizontal (ox) direction according to an embodiment of the present invention.
Figure 20:
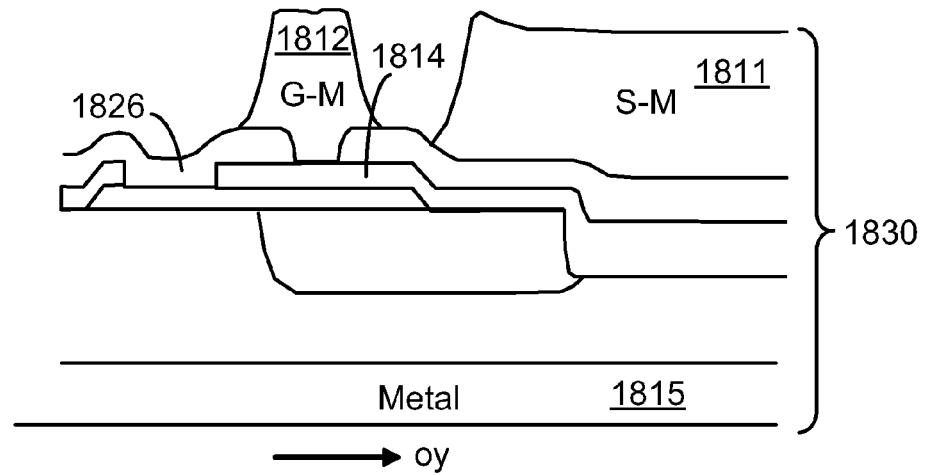
FIG. 20 is a simplified cross-sectional view of the device of FIG. 18 along the vertical (oy) direction according to an embodiment of the present invention.

FIG. 18 a simplified top view diagram illustrating metal patterns of the three-dimensional semiconductor device 1600 of FIG. 16 according to a specific embodiment of the present invention. As shown, source metal 1811 and gate metal 1812 are separated by dielectric 1826. Further details can be seen in FIGS. 19 and 20 discussed below FIGS. 19 and 20 are simplified cross-sectional view diagrams of the device of FIG. 18 along the horizontal (ox) direction and the vertical (oy) direction, respectively, according to an embodiment of the present invention. The (ox) cross section in FIG. 19 is taken across trench cells 1806, whereas the (oy) cross section in FIG. 20 is taken along a trench cell. As shown, source metal 1811 and gate metal 1812 are separated by dielectric 1826. Also shown is metal substrate 1815, which also serves as a drain electrode. As shown in FIG. 20, gate metal 1812 is coupled to a gate conductor 1814, which in turn is connected to trench gate electrodes in the trench cells.

Although the above has been shown using a selected group of components for the device 1600 as shown in FIGS. 16-20, there can be many alternatives, modifications, and variations. For example, some of the components may be expanded and/or combined. Other components may be inserted to those noted above. Depending upon the embodiment, the arrangement of components may be interchanged with others replaced. For example, in FIG. 16, the device is depicted as including two bonded trench MOS transistors. In some embodiments, the trench transistor can include trench gate MOSFET or shielded gate MOSFET. In other embodiments, device 1600 can include other semiconductor devices, such as MOS or bipolar transistors. Additionally, even though the above discussion has centered on power devices, other devices, such as low voltage or logic devices, can also be included in alternative embodiments. It is also noted that in the above figures, the components are drawn for illustrative purposes only and are not necessarily drawn to scale. Further details of these components are found throughout the present specification and more particularly below.

Figure 21A:
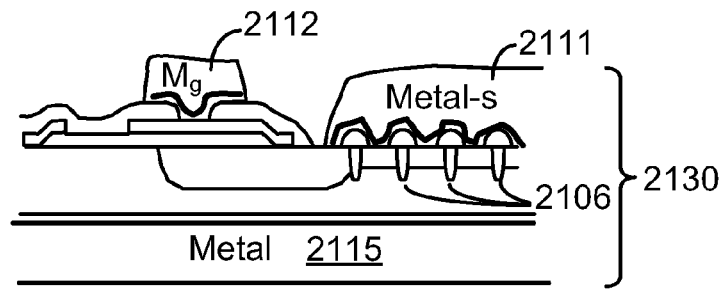
FIGS. 21A-21P are simplified cross-sectional view diagrams illustrating a method for making the three-dimensional semiconductor device 1600 of FIG. 16 according to an embodiment of the present invention.
Figure 21B:
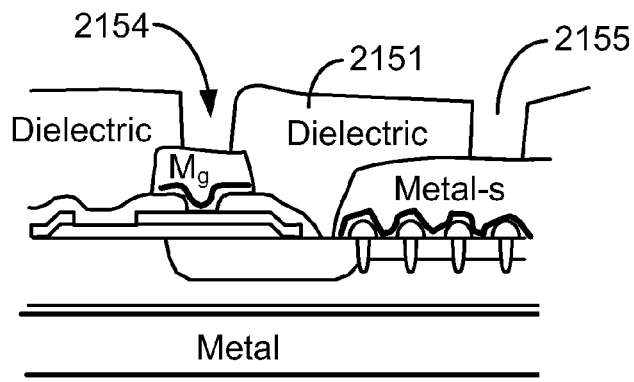
Figure 21C:
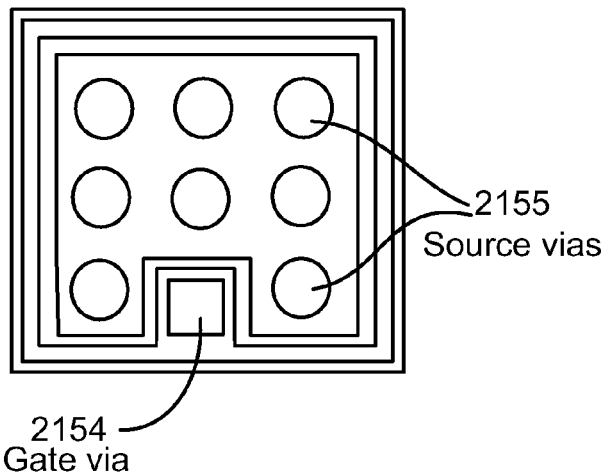
Figure 21D:
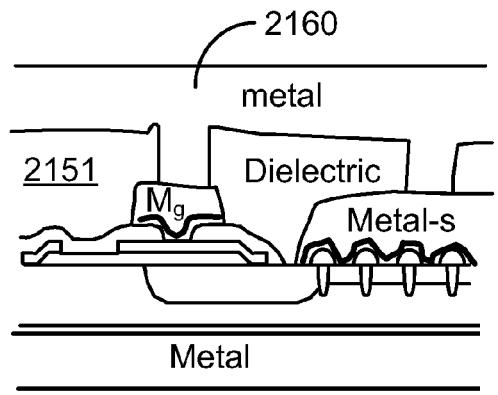
Figure 21E:
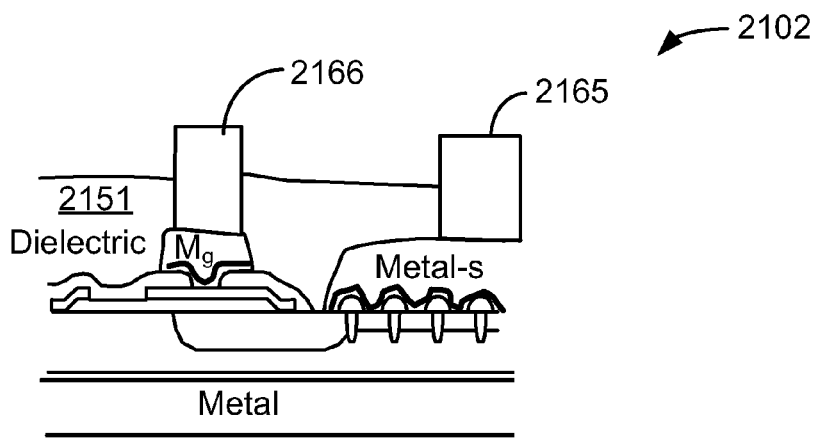
Figure 21F:
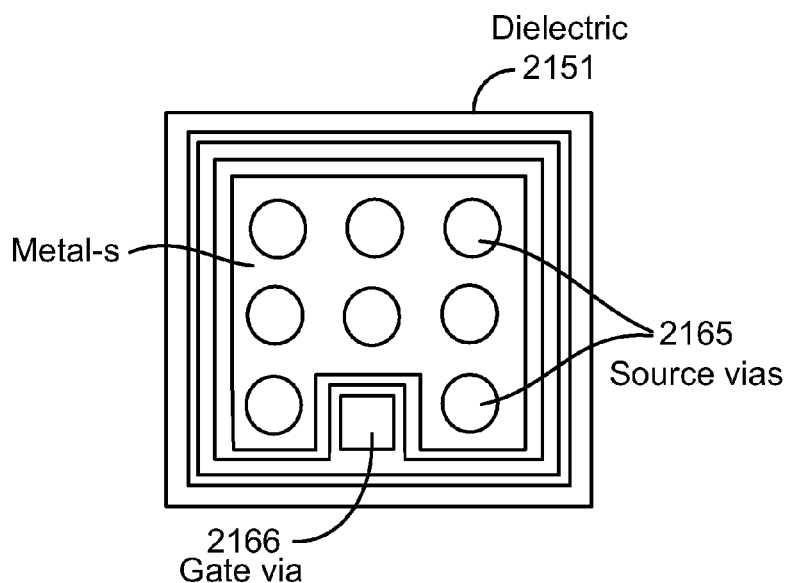
Figure 21G:
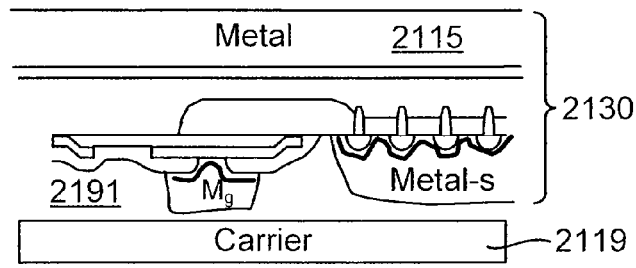
Figure 21H:
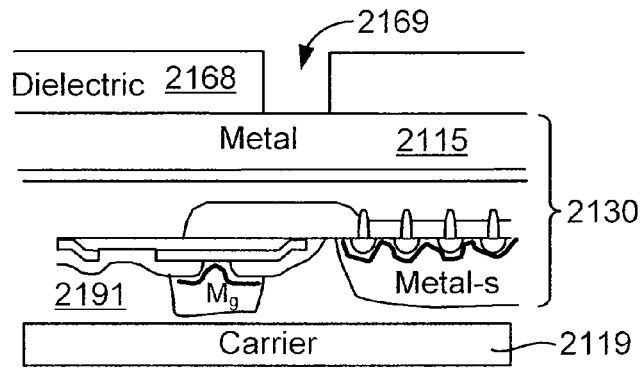
Figure 21I:
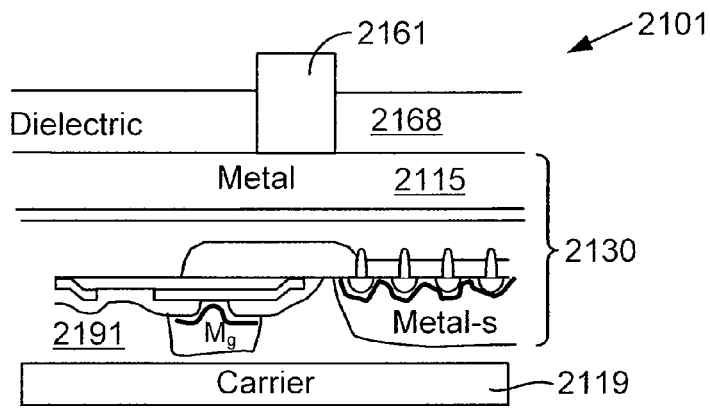
Figure 21J:
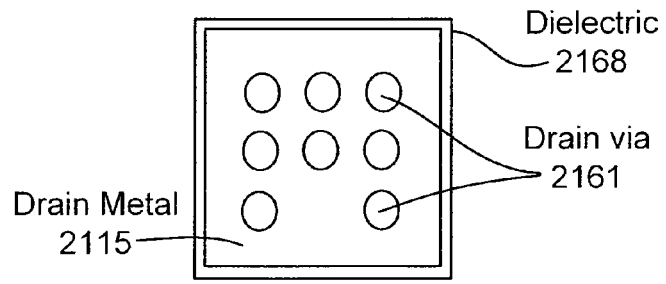
Figure 21K:
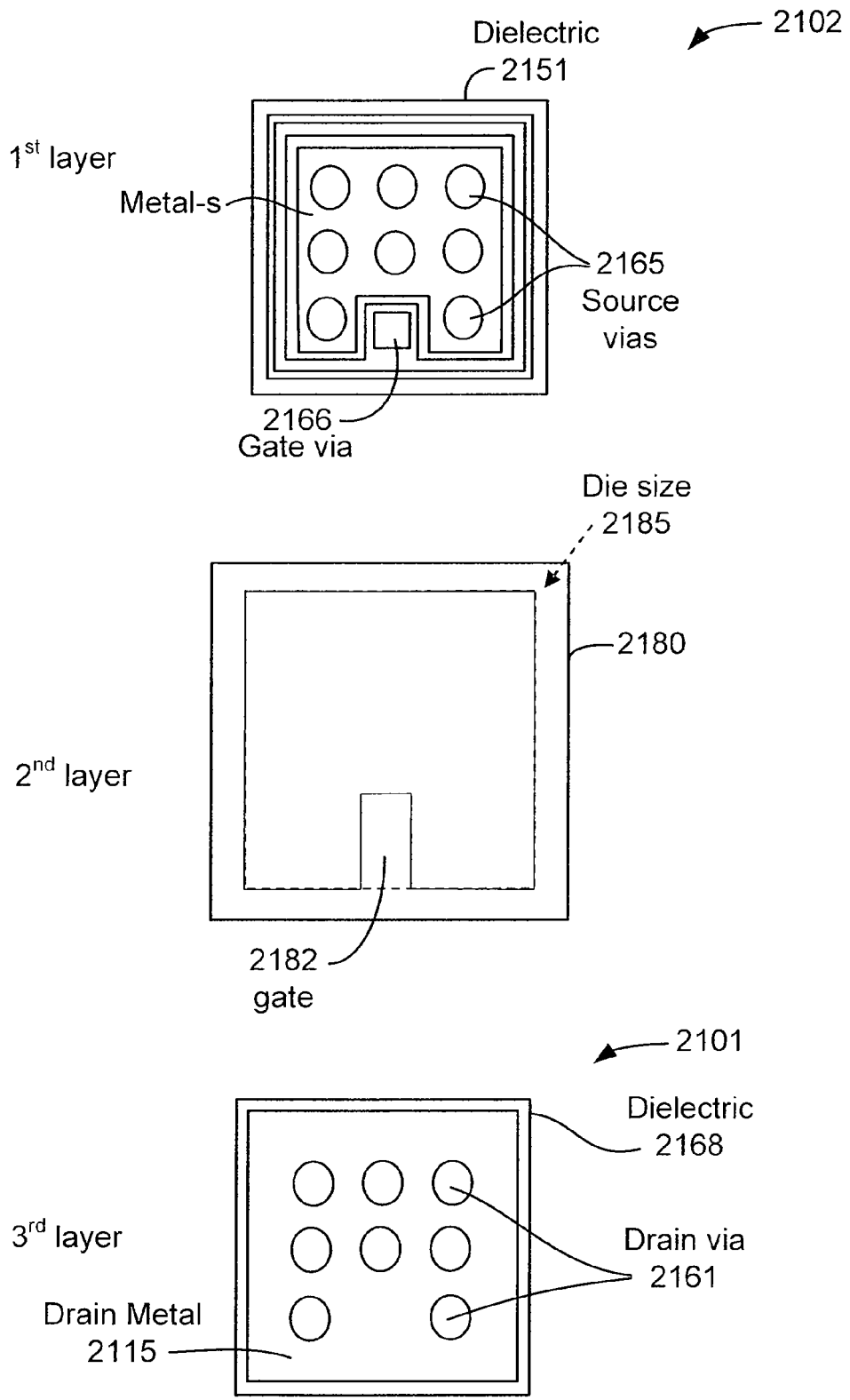
Figure 21L:
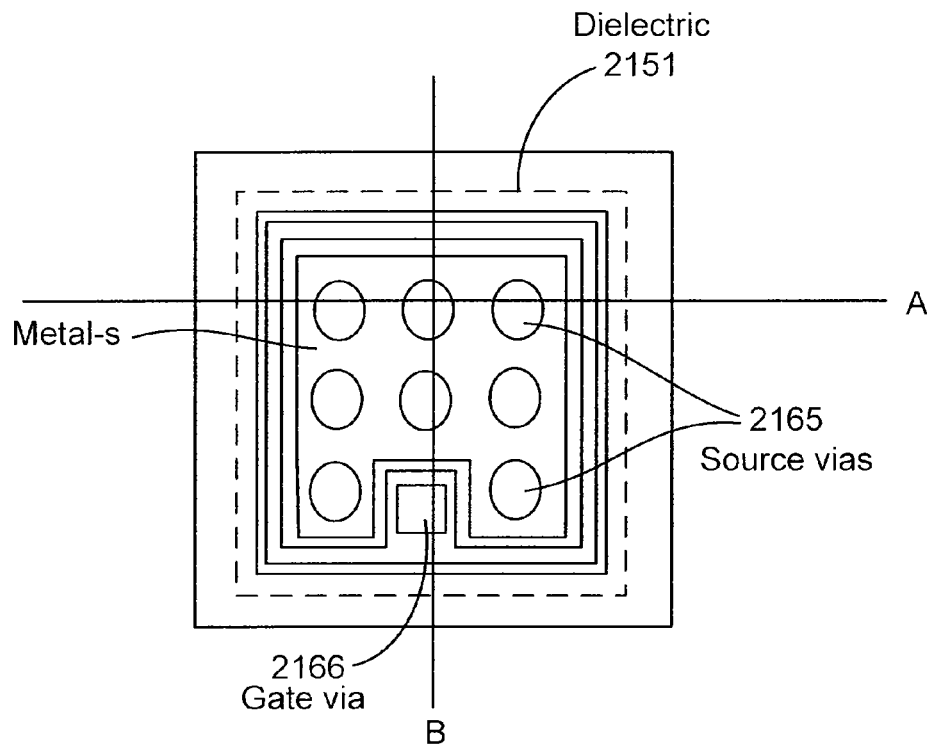
Figure 21M:
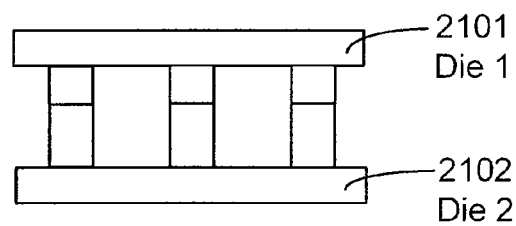
Figure 21N:
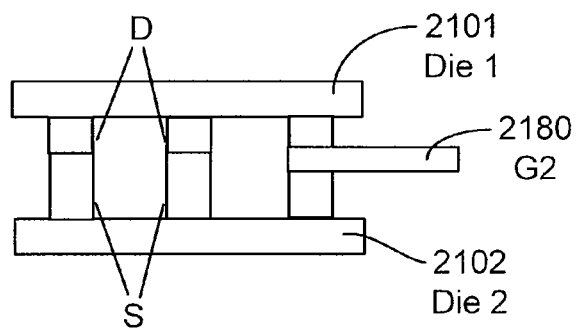
Figure 21O:
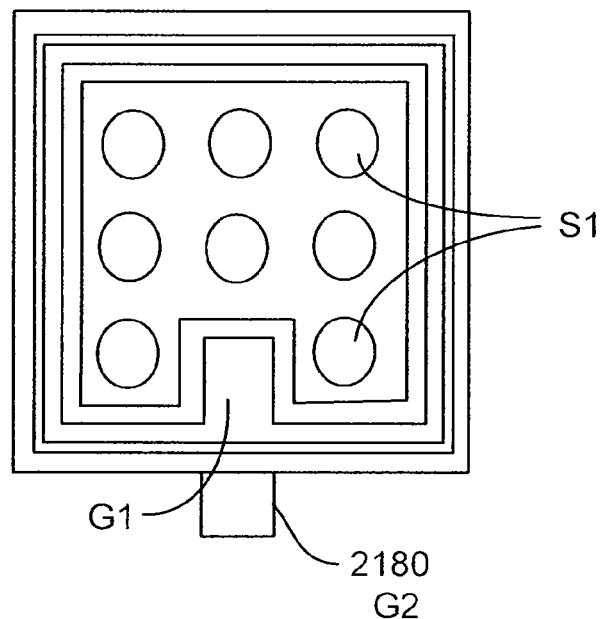
Figure 21P:
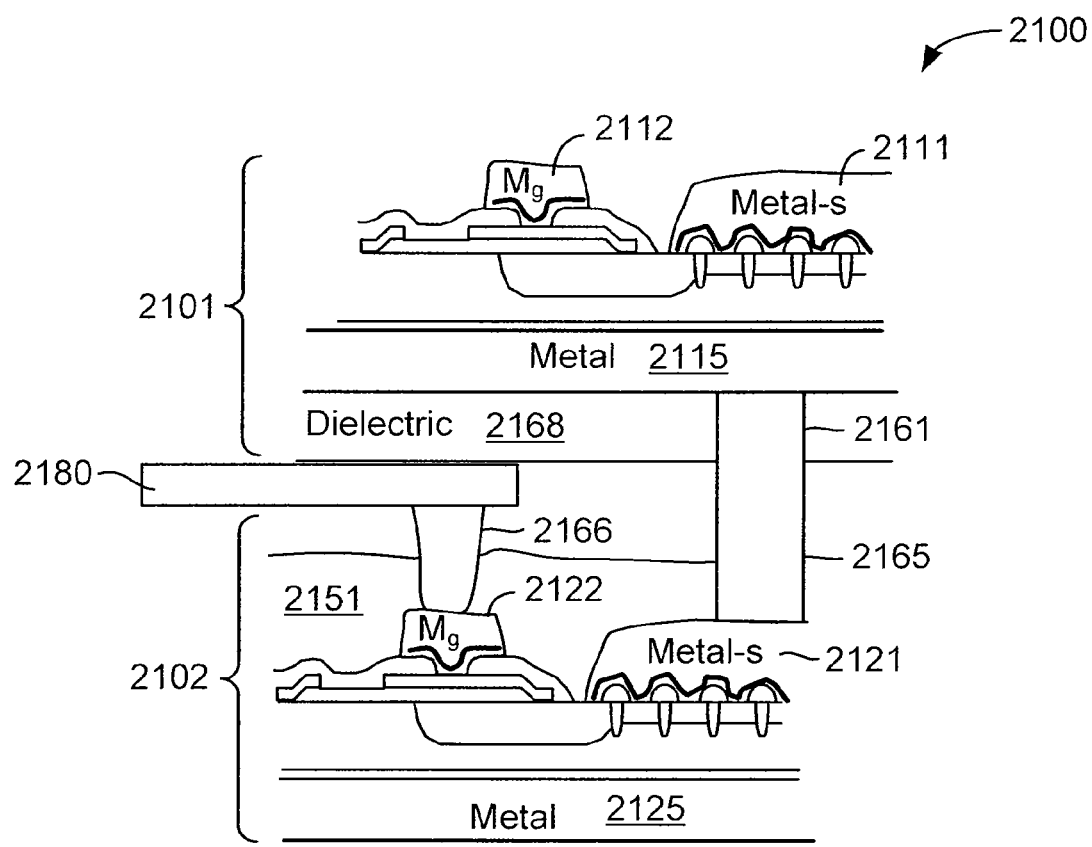

FIGS. 21A-21P are simplified cross-sectional view diagrams illustrating a method for making the three-dimensional semiconductor device 1600 of FIG. 16 according to an embodiment of the present invention. These diagrams are merely examples, which should not unduly limit the scope of the claims herein. One skilled in the art would recognize other variations, modifications, and alternatives. FIGS. 21A-21F illustrate a process for forming a device at the bottom of three-dimensional device, e.g., device 1602. As shown in FIG. 21A, the process for forming a bottom device includes providing a trench MOS transistor 2130. Trench MOS transistor 2130 is similar to device 830 in FIG. 8G described above and includes a semiconductor region on a first metal substrate 2115. The trench MOS transistor 2130 includes a source terminal 2111 and a gate terminal 2112 on a front side of the semiconductor region opposite the metal substrate 2115. The metal substrate 2115 also functions as a drain terminal for device 2130.

In FIG. 21B, a dielectric layer 2151 is formed overlying the trench MOS transistor 2130. Then dielectric layer 2151 is patterned to form vias 2154 and 2155 and to expose a portion of the source terminal and a portion of the gate terminal of the trench MOS transistor. FIG. 21C shows the pattern of the gate via 2154 and source vias 2155. In FIG. 21D, a conductive layer 2160 is formed overlying the patterned dielectric layer. In an embodiment, conductive layer 2160 is also planarized. In FIG. 21E, conductive layer 2160 is patterned to form conductor structures 2165 and 2166. In this example, conductor structure 2165 is coupled to the source terminal, and conductor structure 2166 is coupled to the gate terminal. The device in FIG. 21E, designated as device 2102, can now be used as a bottom device in the bonding process for forming a three-dimensional device. FIG. 21F is a top view of device 2102 showing the pattern of conductors 2165 and 2166 in source vias and gate via, respectively.

FIGS. 21G-21J illustrate a process for forming a device for forming a top device in the three-dimensional device. In FIG. 21G, a carrier substrate 2119 is attached to a front side of a trench MOS transistor such as 2130 describe above in FIG. 21A. In FIG. 21H, a dielectric layer 2168 is formed overlying the metal substrate 2115. The dielectric layer 2168 is then patterned to form at least one via 2169 to expose a portion of the metal substrate 2115. In FIG. 21 H, a conductive layer is formed (not shown) overlying the first dielectric layer and then patterned to form at least one conductive structure 2161 as shown in FIG. 21I. As shown, the conductive structure 2161 is in contact with the exposed portion of the metal substrate 2115. In an embodiment, the conductive structure 2161 extends above the dielectric layer to facilitate subsequent bonding, as shown in FIG. 21I. The device in FIG 21I, designated as device 2101, can now be used as a top device in the bonding process for forming a three-dimensional device. FIG. 21J is a top view of device 2101 showing the pattern of conductors 2161 and dielectric layer 2168. Additionally, drain metal 2115 is under the dielectric layer 2168.

FIG. 21K includes simplified top view diagrams showing three components to be used in a bonding process to form the stacked three-dimensional semiconductor device according to an embodiment of the present invention. Device 2101 is similar to device 2101 of FIG. 21I, a candidate for the top device. Device 2102 is similar to device 2102 of FIG. 21E, a candidate for the bottom device. FIG. 21K also shows a patterned metal layer 2180 having interconnected regions, such as 2182. In a specific embodiment, metal layer 2180 is shown to be larger than the die size of device 2101 and 2102, which is marked by dotted line boundary 2185. The portion of metal layer 2180 outside the die size line provides interconnections between the various regions during the bonding process. Metal layer 2180 can be a patterned metal thin film suitable for bonding applications and can be fabricated using known methods. For example, in a specific embodiment, metal layer 2180 can be made using lead-frame techniques.

In FIG. 21L, the three components in FIG. 21K are bonded together, with layer 2180 between devices 2101 and 2102. FIG. 21M is a cross-sectional view of the device in 21L along the line A, and FIG. 21N is a cross-sectional view along the line B. It can be seen in FIG. 21N that the source conductors of device 2102 are bonded to the drain conductors of device 2101, and a region from the metal layer 2180 is bonded to a gate terminal of device 2102 and also provides an external contact shown as G2. FIG. 21O is a top view of the bonded device, with the outside portions of metal layer 2180 removed. In FIG. 21O, G1 designates gate via for making contact to the gate terminal of the top device 2101 (shown as 2112 in FIG. 21P), and S1 designates source vias for making contact to the source terminal of the top device 2101 (shown as 2111 in FIG. 21P). G2 is a contact to the gate terminal of the bottom device 2102 (shown as 2180 in FIG. 21P). The drain terminal (not shown) of the bottom device provides a drain terminal of the bonded device.

FIG. 21P is a cross-sectional view of the bonded device 2100. Device 2100 is substantially identical to device 1600 in FIG. 16. The discussion of device 1600 above is also applicable to device 2100 in FIG. 21P. In particular, a source conductor 2165 of device 2102 is bonded to the drain conductor 2115 of device 2101, and a region from the metal layer 2180 is bonded to a gate conductor 2122 of device 2102.

The above sequences of processes provide methods for forming bonded devices according to embodiments of the present invention. As shown, the methods use a combination of processes including providing a patterned conductive layer and additional conductive structures for bonding two devices to form a stacked device having a specific electrical connection. Other alternatives can also be provided where steps are added, one or more steps are removed, or one or more steps are provided in a different sequence without departing from the scope of the claims herein. For example, depending on the embodiments, the terminals of the two devices can be connected in a variety of ways, depending on the pattern in the metal layer and the configuration of conductor structures.

Additionally, although the above discussions are directed to trench MOS devices in specific embodiments of the present invention, it is understood that the techniques provided herein are applicable to other semiconductor devices as well. For example, the techniques can be applied to n-channel or p-channel MOSFETs, trench gate or shielded gate trench FETs, planer gate FETs, npn or pnp bipolar transistors, and diodes, etc. Moreover, techniques described in the context of shielded gate trench FETs can be applied to shielded gate IGBTs by merely reversing the conductivity of the substrate. Many of these as well as other power devices to which various embodiments of the invention may be advantageously applied are disclosed in the commonly assigned U.S. patent application Ser. No. 11/026,276 (now U.S. Pat. No. 7,345, 342), entitled "Power Semiconductor Devices and Methods of Manufacture," which is hereby incorporated by reference in its entirety.

Furthermore, although the above discussions are directed to various methods for bonding multiple single devices, it is understood that the methods are applicable to bonding wafers, each of which can contain a plurality of devices. In these applications, the wafers are bonded together first. Then a dicing process can be used to separate the bonded wafers into individual bonded devices.

While the preferred embodiments of the invention have been illustrated and described, it will be clear that the invention is not limited to these embodiments only. Numerous modifications, changes, variations, substitutions, and equivalents will be apparent to those skilled in the art without departing from the spirit and scope of the invention as described in the claims.

What is claimed is:

1. A three-dimensional semiconductor device, comprising:
   a first semiconductor device having a first metal substrate on its back side, the first metal substrate also functioning as a first terminal of the first semiconductor device;
   a first conductive structure coupled to a back side of the first metal substrate;
   a second semiconductor device having a first terminal and a second terminal on its front side;
   a second conductive structure coupled to the first terminal of the second semiconductor device, the second conductive structure being bonded to the first conductive structure and providing electrical contact between the back side of the first semiconductor device and the front side of the second semiconductor device;
   a third conductive structure coupled to the second terminal of the second semiconductor device; and
   a patterned metal layer located between the first and the second semiconductor devices, the patterned metal layer including at least a first region, the first region being bonded to the third conductive structure for providing an external contact;
   wherein each of the first and the second semiconductor devices comprises a trench power MOS transistor;
   wherein the first conductor is coupled to a drain terminal of the first semiconductor device and the second conductor is coupled to a source terminal of the second semiconductor device, whereby the three-dimensional semiconductor device comprises a series combination of the first and the second semiconductor devices.

2. A three-dimensional semiconductor device, comprising:
   a first semiconductor device having a first metal substrate on its back side, the first metal substrate also functioning as a first terminal of the first semiconductor device;
   a first conductive structure coupled to a back side of the first metal substrate;
   a second semiconductor device having a first terminal and a second terminal on its front side;
   a second conductive structure coupled to the first terminal of the second semiconductor device, the second conductive structure being bonded to the first conductive structure and providing electrical contact between the back side of the first semiconductor device and the front side of the second semiconductor device;
   a third conductive structure coupled to the second terminal of the second semiconductor device; and
   a patterned metal layer located between the first and the second semiconductor devices, the patterned metal layer including at least a first region, the first region being bonded to the third conductive structure for providing an external contact;

wherein each of the first and the second semiconductor devices comprises a trench power MOS transistor;

wherein the first region of the patterned metal layer provides a contact to a gate terminal of the second semiconductor device.

3. A method for forming a three-dimensional semiconductor device, comprising:

providing a first semiconductor device having a first metal substrate on its back side, the first metal substrate also functioning as a first terminal of the first semiconductor device;

forming a first conductive structure coupled to the first metal substrate;

providing a second semiconductor device having a first terminal and a second terminal on its front side;

forming a second conductive structure and a third conductive structure coupled to first and second terminals of the second semiconductor device, respectively;

providing a patterned conductive layer including at least a first region;

bonding the first conductive structure to the second conductive structure to provide electrical contact between the first semiconductor device and the second semiconductor device;

bonding the first region of the patterned conductive layer to the third conductive structure; and selectively removing portions of the patterned conductive layer to provide an external contact for the three-dimensional semiconductor device;

wherein at least one of the first and the second semiconductor devices comprises an MOS transistor;

wherein the first conductor is coupled to a drain terminal of the first semiconductor device and the second conductor is coupled to a source terminal of the second semiconductor device, whereby the three-dimensional semiconductor device comprises a series combination of the first and the second semiconductor devices.

4. The method of claim 3 wherein each of the first and the second semiconductor devices comprises a trench power MOS transistor, and wherein the first region of the patterned metal layer provides a contact to a gate terminal of the second semiconductor device.

* * * * *